(12) United States Patent
Taniguchi

(10) Patent No.: US 8,816,796 B2
(45) Date of Patent: Aug. 26, 2014

(54) MULTILAYER FILTER

(75) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 435 days.

(21) Appl. No.: 13/276,397

(22) Filed: Oct. 19, 2011

(65) Prior Publication Data

US 2012/0098623 A1  Apr. 26, 2012

(30) Foreign Application Priority Data

Oct. 21, 2010 (JP) ................................. 2010-236068

(51) Int. Cl.
*H03H 7/09* (2006.01)
*H03H 7/42* (2006.01)
*H01P 5/10* (2006.01)
*H03H 7/01* (2006.01)
*H03H 1/00* (2006.01)

(52) U.S. Cl.
CPC . *H03H 7/42* (2013.01); *H03H 7/09* (2013.01); *H03H 7/1775* (2013.01); *H03H 2001/0085* (2013.01); *H01P 5/10* (2013.01)
USPC ............................................ 333/185; 333/25

(58) Field of Classification Search
CPC .......................... H03H 7/42; H03H 2001/0085
USPC .................................................... 333/25, 185
See application file for complete search history.

(56) References Cited

U.S. PATENT DOCUMENTS

2011/0169586 A1   7/2011   Taniguchi

FOREIGN PATENT DOCUMENTS

JP   2005-045447 A   2/2005
WO   2010055725 A1   5/2010

OTHER PUBLICATIONS

Translation of Publication WO 2010055725 A1, Application PCT/JP2009/065572, Inventor—Taniguchi, Publication Date May 20, 2010; Translation obtained Feb. 19, 2014 from WIPO.*
Taniguchi, "Multilayer Filter," U.S. Appl. No. 13/276,390, filed Oct. 19, 2011.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A multilayer filter includes a laminate including a plurality of dielectric layers stacked on each other. Inner layer electrodes and outer terminals are provided in the laminate. A second coil electrode constituting a balanced-side inductor is defined by one of the inner layer electrodes. The second coil electrode has a coiled shape, and includes a first end connected to a first coil electrode through a via electrode and a second end connected to a third coil electrode through a via electrode. The second coil electrode is connected at a predetermined position along the winding direction thereof to a ground terminal, as one of the outer terminals, through an electrode for connection to a ground. The position where the ground connection electrode is connected to the second coil electrode is determined based on a balance characteristic in the balanced terminal side.

6 Claims, 22 Drawing Sheets

MULTILAYER FILTER

BACKGROUND OF THE INVENTION

1. Field of the Invention

The present invention relates to a multilayer filter including a plurality of dielectric layers stacked on each other and including electrode patterns provided thereon, and more particularly, to a multilayer filter including balanced output terminals.

2. Description of the Related Art

Previously, various types of multilayer circuit elements have been proposed in which predetermined circuit functions are realized by stacking a plurality of dielectric layers on which predetermined electrode patterns are formed. As one of those multilayer circuit elements, there is a multilayer filter for realizing a filter function. Further, there is a multilayer filter having the unbalanced-balanced transforming function (hereinafter referred to as a "multilayer balanced filter"), as disclosed in Japanese Unexamined Patent Application Publication No. 2005-45447.

In the multilayer balanced filter disclosed in Japanese Unexamined Patent Application Publication No. 2005-45447, a plurality of ½-wavelength resonators each opened at both ends are arranged to be electromagnetically coupled with each other. An unbalanced input terminal is connected to the ½-wavelength resonator at one end, and balanced output terminals are connected respectively to two terminals of the ½-wavelength resonator at the other end. Those plural ½-wavelength resonators are provided by inner layer electrodes that are formed in a laminate (multilayer body).

However, because the multilayer balanced filter disclosed in Japanese Unexamined Patent Application Publication No. 2005-45447 has such a structure that an inductor on the balanced output side is formed by the inner layer electrode and both ends of the inductor are directly connected to the balanced output terminals, it is not easy to set a phase balance between the balanced output terminals arranged in a pair to a desired value by utilizing the shape of the inner layer electrode, which forms the inductor, and a wiring pattern for the inner layer electrode.

SUMMARY OF THE INVENTION

Accordingly, preferred embodiments of the present invention provide a multilayer filter having a good balance characteristic.

A preferred embodiment of the present invention provides a multilayer filter including a laminate including a plurality of dielectric layers stacked on each other, and including an unbalanced terminal, a first balanced terminal and a second balanced terminal corresponding to the unbalanced terminal, and a filter circuit, which are defined by inner layer electrodes and outer electrodes in the laminate. The multilayer filter includes an unbalanced-side inductor connected between the unbalanced terminal and a ground, and a balanced-side inductor electromagnetically coupled with the unbalanced-side inductor, the balanced-side inductor including a first end connected to the first balanced terminal and a second end connected to the second balanced terminal. The balanced-side inductor includes a coil electrode provided in an inner layer of the laminate and having a substantially helical shape. The coil electrode constituting the balanced-side inductor is connected at a predetermined position along a winding direction thereof to the ground through an electrode for connection to the ground.

With the arrangement described above, the point connected to the ground through the ground connection electrode serves as a phase reference point for the balanced-side inductor. Accordingly, the desired balance characteristic can be realized with high accuracy by appropriately determining the position where the ground connection electrode is connected to the coil electrode constituting the balanced-side inductor.

In the multilayer filter according to a preferred embodiment of the present invention, a grounding capacitor defined by a pair of opposed electrodes, which are positioned opposite to each other with the dielectric layer interposed therebetween, is connected in series between the coil electrode and the ground at an intermediate point of the ground connection electrode.

The arrangement described above represents one practical example of grounding the intermediate point of the coil electrode constituting the balanced-side inductor.

In the multilayer filter according to a preferred embodiment of the present invention, one of the opposed electrodes constituting the grounding capacitor and positioned on the side closer to the coil electrode is connected to a DC feed terminal.

The arrangement described above represents one practical example of feeding a DC bias to the balanced-side inductor. By adopting the arrangement described above, the DC bias can be accurately fed, and a signal supplied from the DC feed terminal and a signal passing through the balanced-side inductor can be separated from each other in terms of frequency.

In the multilayer filter according to a preferred embodiment of the present invention, the coil electrode constituting the balanced-side inductor is formed preferably by connecting three or more odd coil electrodes in series. The coil electrode at a center in an array sequence of the odd coil electrodes and a coil electrode constituting the unbalanced-side inductor are provided and positioned in the laminate to be electromagnetically coupled with each other. The odd numbered coil electrodes have the same winding direction as viewed in a stacking direction.

The arrangement described above represents one more detailed example of the multilayer filter. By arranging the coil electrodes for the balanced-side inductor as described above, the multilayer filter can be realized which has a good balance characteristic, which can achieve desired impedances, and which causes a small insertion loss.

In the multilayer filter according to a preferred embodiment of the present invention, the coil electrode at the center is arranged over a larger area than areas over which the other coil electrodes constituting the balanced-side inductors are arranged, when looking at the laminate from above. The coil electrode constituting the unbalanced-side inductor is arranged substantially opposite in the stacking direction to a portion of the coil electrode at the center, which portion is not overlapped with the other coil electrodes constituting the balanced-side inductors.

The arrangement described above represents one practical example of electromagnetically coupling the balanced-side inductor and the unbalanced-side inductor with each other by using the inner-layer coil electrodes in the laminate.

In the multilayer filter according to a preferred embodiment of the present invention, a balanced-side capacitor is connected between the first balanced terminal and the second balanced terminal.

The balanced-side capacitor includes a first capacitor including opposed electrodes, one of which is a first inner-layer plate electrode electrically conducted to the first balanced terminal and the other of which is a first floating electrode not connected to the ground, and a second capacitor including opposed electrodes, one of which is a second innerlayer plate electrode electrically conducted to the second balanced terminal and the other of which is a second floating electrode not connected to the ground. The first capacitor and the second capacitor are connected in series.

The arrangement described above represents one practical example of the capacitor connected to the balanced terminal side. With the above-described arrangement, a connecting point between the first capacitor and the second capacitor, which are connected in series between the first balanced terminal and the second balanced terminal, serves as a floating ground. Accordingly, the balance characteristic of the multilayer filter is not affected by a pattern that connects the multilayer filter to the ground and a mounted state of the ground of the multilayer filter to a mother board. As a result, the multilayer filter having a further improved balance characteristic can be realized.

According to various preferred embodiments of the present invention, the multilayer filter having a good balance characteristic can be realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A multilayer filter according to a first preferred embodiment of the present invention will be described below with reference to the drawings.

Figure 1:
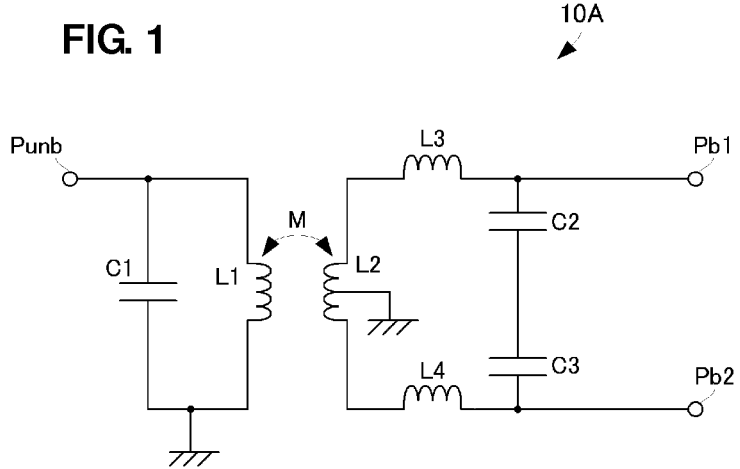
FIG. 1 is a circuit diagram of a multilayer filter according to a first preferred embodiment of the present invention.

First, a circuit configuration of a multilayer filter 10A is described. FIG. 1 is a circuit diagram of the multilayer filter 10A according to the first preferred embodiment of the present invention.

The multilayer filter 10A includes an unbalanced terminal Punb to input and output an unbalanced signal, and a first balanced terminal Pb1 and a second balanced terminal Pb2 to input and output balanced signals.

A parallel resonance circuit including an unbalanced-side capacitor C1 and an unbalanced-side inductor L1 is connected between the unbalanced terminal Punb and the ground.

Three balanced-side inductors L3, L2 and L4 are connected in series between the first balanced terminal Pb1 and the second balanced terminal Pb2. The balanced-side inductors L3, L2 and L4 are connected in the order named, i.e., in the order of the balanced-side inductors L3, L2 and L4, looking from the first balanced terminal Pb1. As described later, the balanced-side inductors L3, L2 and L4 are preferably defined by substantially helical coils having the same winding direction, for example. While three balanced-side inductors are preferably used in the illustrated preferred embodiment, the number of balanced-side inductors may be some other suitable value as long as it is an odd value except for one.

The balanced-side inductor L2 is arranged to be electromagnetically coupled with the unbalanced-side inductor L1. Such an arrangement causes a mutual inductor M to act between the balanced-side inductor L2 and the unbalanced-side inductor L1.

The balanced-side inductor L2 is connected to the ground at a predetermined point along the winding direction thereof.

Further, a serial circuit including a first balanced-side capacitor C2 and a second balanced-side capacitor C3 is connected between the first balanced terminal Pb1 and the second balanced terminal Pb2. The first balanced-side capacitor C2 and the second balanced-side capacitor C3 are connected in the order named, i.e., in the order of the first and second balanced-side capacitor C2 and C3, looking from the first balanced terminal Pb1.

In the multilayer filter 10A having the above-described circuit configuration, when an unbalanced signal is input through the unbalanced terminal Punb, the input signal is subjected to unbalanced-balanced transformation, and balanced signals in predetermined phases are output from the first balanced terminal Pb1 and the second balanced terminal Pb2. In addition, a center frequency of a filter passage band is designed by the resonance circuit including the unbalanced-side inductor L1 and the unbalanced-side capacitor C1. Thus, a filter with the unbalanced-balanced transforming function is provided.

Figure 2:
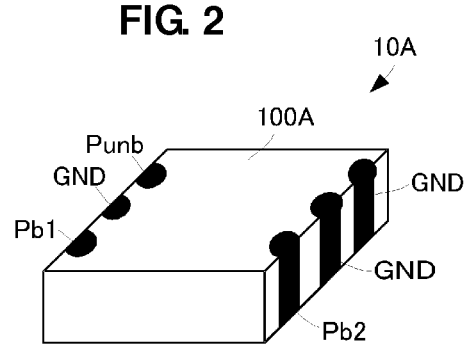
FIG. 2 is an external perspective view of the multilayer filter according to the first preferred embodiment of the present invention.
Figure 3:
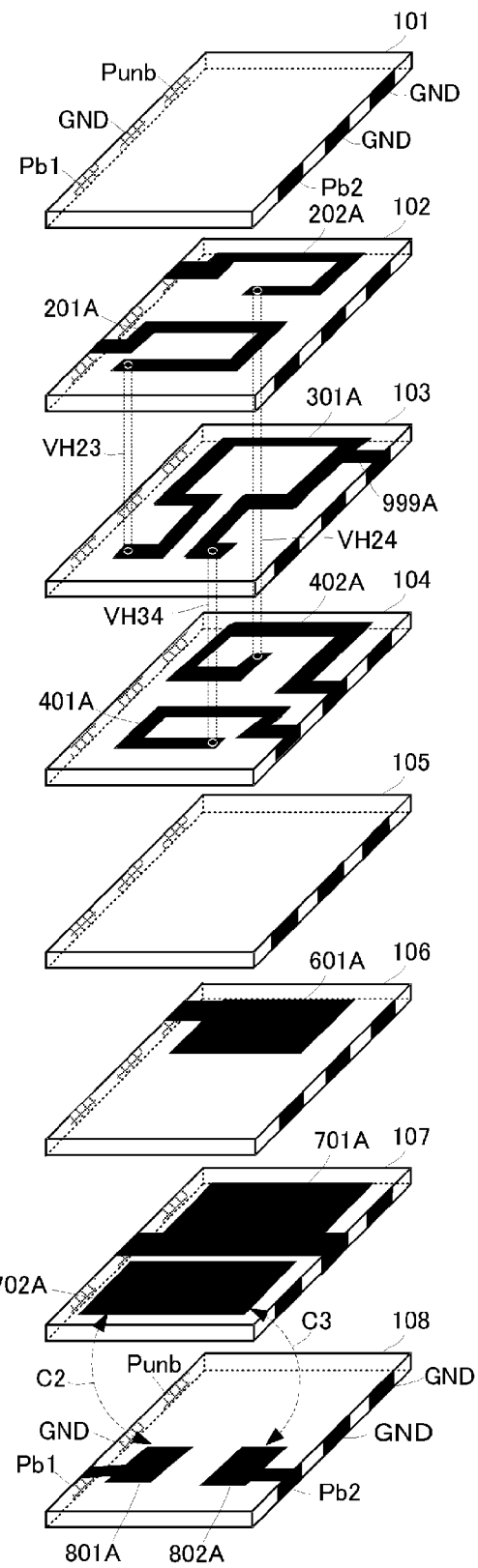
FIG. 3 is an exploded perspective view of the multilayer filter according to the first preferred embodiment of the present invention.

A structure of the multilayer filter 10A for realizing the above-described circuit configuration will be described below. FIG. 2 is an external perspective view of the multilayer filter 10A according to the first preferred embodiment, and FIG. 3 is an exploded perspective view of the multilayer filter 10A according to the first preferred embodiment of the present invention.

The multilayer filter 10A is realized with a laminate 100A that preferably includes eight dielectric layers 101 to 108, for example, stacked on each other.

As illustrated in FIG. 2, the laminate 100A preferably is substantially parallelepiped in its external shape. An outer electrode for the unbalanced terminal (hereinafter referred to as the "unbalanced terminal Punb"), a ground electrode (hereinafter referred to as a "ground terminal GND"), and an outer electrode for the first balanced terminal (hereinafter referred to as the "first balanced terminal Pb1") are provided on a first lateral surface of the laminate 100A and are arranged in the order named. Two ground terminals GND and an outer electrode for the second balanced terminal (hereinafter referred to as the "second balanced terminal Pb2") are provided on a second lateral surface of the laminate 100A, which is positioned opposite to the first lateral surface thereof, and are arranged in the order named. In such a structure, the first balanced terminal Pb1 and the second balanced terminal Pb2 are arranged opposite to each other.

The unbalanced terminal Punb, the first balanced terminal Pb1, the second balanced terminal Pb2, and the ground terminals GND, serving as outer terminals of the multilayer filter 10A, preferably have shapes extending in the stacking direction and are each defined by an electrode pattern spanning over all the dielectric layers 101 to 108 that constitute the laminate 100A. It is to be noted that, in the following description of the dielectric layers, the positions where the outer terminals are provided and the shapes thereof are not described except for connection relationships of the outer terminals with respect to inner layer electrodes.

Electrode patterns provided on the dielectric layers 101 to 108 will be described in detail below. The following description is made on an assumption that an uppermost layer of the laminate 100A is called the dielectric layer 101 and a lowermost layer of the laminate 100A is called the dielectric layer 108 while the reference number of the dielectric layer is successively increased toward the lowermost layer.

Only the electrode patterns for the above-mentioned outer terminals are provided on the dielectric layer 101 that is the uppermost layer of the laminate 100A. Though not illustrated, a marking electrode used to determine the mounting direction is preferably provided on an upper surface of the dielectric layer 101, i.e., on a top surface of the laminate 100A.

Coil electrodes 201A and 202A are provided on the dielectric layer 102. One end of the coil electrode 201A is connected to the first balanced terminal Pb1 in the first lateral surface. The coil electrode 201A preferably has a coiled shape, as viewed from above, starting from the one end thereof. The other end of the coil electrode 201A is connected to one end of a coil electrode 301A in the dielectric layer 103 through an electroconductive via electrode VH23. The coil electrode 201A constitutes the balanced-side inductor L3.

One end of the coil electrode 202A is connected to the unbalanced terminal Punb in the first lateral surface. The coil electrode 202A preferably has a coiled shape, as viewed from above, starting from the one end thereof. The other end of the coil electrode 202A is connected to one end of a coil electrode 402A in the dielectric layer 104 through an electroconductive via electrode VH24.

The coil electrode 202A is located at a position where it is electromagnetically coupled with the coil electrode 301A in the dielectric layer 103.

The coil electrode 301A is provided on the dielectric layer 103. The one end of the coil electrode 301A is, as described above, connected to the other end of the coil electrode 201A through the via electrode VH23.

The coil electrode 301A preferably has a coiled shape substantially over an entire surface of the dielectric layer 103, starting from the one end thereof. In other words, the coil electrode 301A is arranged to extend over a region larger than that where the coil electrode 201A is located, when looking at the laminate 100A from above. Further, the coil electrode 301A is arranged in partially opposing relation to the coil electrode 202A in the stacking direction. Such an arrangement enables the coil electrode 301A and the coil electrode 202A to be electromagnetically coupled with each other.

The other end of the coil electrode 301A is connected to one end of a coil electrode 401A in the dielectric layer 104 through an electroconductive via electrode VH34. The coil electrode 301A constitutes the balanced-side inductor L2.

In addition, the coil electrode 301A is connected at a predetermined position along the winding direction thereof to the ground terminal GND at an end of the second lateral surface through an electrode 999A for connection to the ground. The predetermined point of the balanced-side inductor L2 is thereby connected to the ground.

The coil electrodes 401A and 402A are provided on the dielectric layer 104. The one end of the coil electrode 401A is, as described above, connected to the other end of the coil electrode 301A through the via electrode VH34.

The coil electrode 401A preferably has a coiled shape, starting from the one end thereof. The coil electrode 401A is preferably arranged to extend in the same winding direction as the coil electrode 201A, when looking at the laminate 100A from above. Further, a region where the coil electrode 401A is located is substantially matched with a region where the coil electrode 201A is located, when looking at the laminate 100A from above. The other end of the coil electrode 401A is connected to the second balanced terminal Pb2 in the second lateral surface. The coil electrode 401A constitutes the balanced-side inductor L4.

The one end of the coil electrode 402A is, as described above, connected to the other end of the coil electrode 202A through the via electrode VH24. The coil electrode 402A preferably has a coiled shape, starting from the one end thereof. The coil electrode 402A is preferably configured to extend in the same winding direction as the coil electrode 202A, when looking at the laminate 100A from above. Further, a region where the coil electrode 402A is located is substantially matched with a region where the coil electrode 202A is located, when looking at the laminate 100A from above. With such an arrangement, the coil electrode 402A can also be electromagnetically coupled with the coil electrode 301A.

The other end of the coil electrode 402A is connected to the ground terminal GND at a center of the second lateral surface. The coil electrode 202A, the via electrode VH24, and the coil electrode 402A constitute the unbalanced-side inductor L1.

With such an arrangement, the balanced-side inductor L2 and the unbalanced-side inductor L1 are electromagnetically coupled with each other such that the balanced-side inductor L2 and the unbalanced-side inductor L1 provide the mutual inductor M.

No patterns for the inner layer electrodes are provided on the dielectric layer 105.

A plate electrode 601A having a substantially rectangular shape, as viewed from above, is provided on the dielectric layer 106. The plate electrode 601A is located in a region on the same side as the regions where the coil electrodes 202A and 402A constituting the unbalanced-side inductor L1 are located, when looking at the laminate 100A from above, i.e., in a region overlapping with the coil electrode 202A and 402A as viewed from above. The plate electrode 601A corresponds to one of opposed electrodes of the unbalanced-side capacitor C1.

Plate electrodes 701A and 702A, each having a substantially rectangular shape as viewed from above, are provided on the dielectric layer 107. The plate electrode 701A is located at a position opposite to the plate electrode 601A in the stacking direction. With such an arrangement, the plate electrode 701A serves as the other of the opposed electrodes of the unbalanced-side capacitor C1. Thus, the plate electrodes 601A and 701A and the dielectric layer 106 constitute the unbalanced-side capacitor C1. The plate electrode 701A is connected to the ground terminal GND in the first lateral surface and to the ground terminal GND at the center of the second lateral surface. As a result, the resonance circuit including the unbalanced-side capacitor C1 and the unbalanced-side inductor L1 is provided.

The plate electrode 702A is preferably arranged to define a floating electrode that is not connected to any outer terminals including the ground terminals GND.

Plate electrodes 801A and 802A, each having a substantially rectangular shape as viewed from above, are provided on the dielectric layer 108. The plate electrode 801A is arranged in opposing relation to the plate electrode 702A in the stacking direction. With such an arrangement, the first balanced-side capacitor C2 is constituted by the plate electrodes 801A and 702A with the dielectric layer 107 interposed therebetween. The plate electrode 801A is connected to the first balanced terminal Pb1 in the first lateral surface.

The plate electrode 802A is also arranged in opposing relation to the plate electrode 702A in the stacking direction. With such an arrangement, the second balanced-side capacitor C3 is constituted by the plate electrodes 802A and 702A with the dielectric layer 107 interposed therebetween. The plate electrode 802A is connected to the second balanced terminal Pb2 in the second lateral surface.

Thus, the multilayer filter 10A having the circuit configuration illustrated in FIG. 1, can be realized with the laminate 100A. The multilayer filter 10A having the above-described structure can provide the following advantageous effects in operation.

Figure 4A:
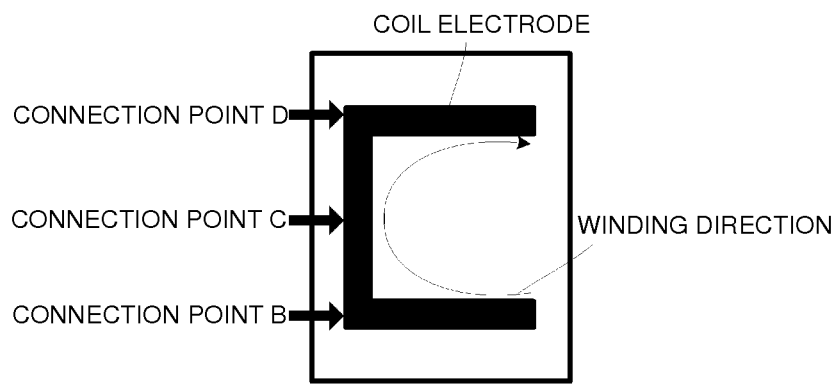
FIGS. 4A to 4D are illustrations used to explain the concept of setting a balance characteristic in the multilayer filter according to the first preferred embodiment of the present invention.
Figure 4B:
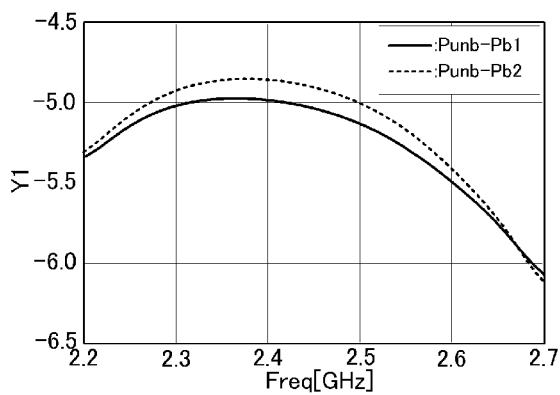
Figure 4C:
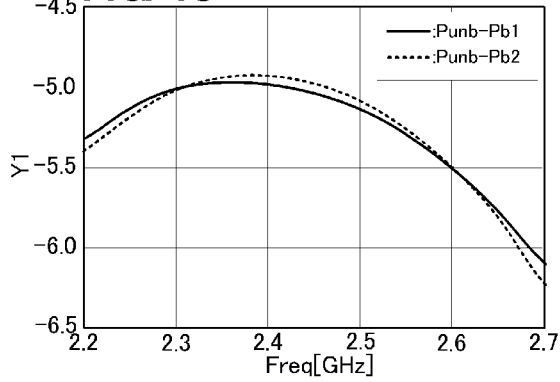
Figure 4D:
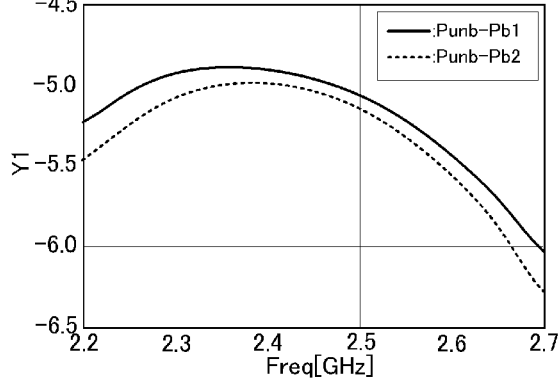

FIGS. 4A to 4D are illustrations used to explain the concept of setting a balance characteristic in the multilayer filter according to the first preferred embodiment of the present invention. FIG. 4A illustrates several practical examples of a ground connection point of the coil electrode, which defines the balanced-side inductor L2. FIG. 4B illustrates a balance characteristic when the coil electrode is connected to the ground at a connection point B in FIG. 4A. FIG. 4C illustrates a balance characteristic when the coil electrode is connected to the ground at a connection point C in FIG. 4A. FIG. 4D illustrates a balance characteristic when the coil electrode is connected to the ground at a connection point D in FIG. 4A. In FIGS. 4B, 4C and 4D, a solid line represents an amplitude characteristic from the unbalanced terminal Punb to the first balanced terminal Pb1 in a pass band, and a dotted line represents an amplitude characteristic from the unbalanced terminal Punb to the second balanced terminal Pb2 in the pass band.

As illustrated in FIGS. 4A to 4D, balance of the amplitude characteristics from the unbalanced terminal Punb to the first balanced terminal Pb1 and the second balanced terminal Pb2 is changed by changing the connection point of the coil electrode to the ground along the winding direction. By using the connection point C in FIG. 4A, as illustrated in FIG. 4C, the amplitude characteristic from the unbalanced terminal Punb to the first balanced terminal Pb1 and the amplitude characteristic from the unbalanced terminal Punb to the second balanced terminal Pb2 are substantially matched with each other, and a good balance characteristic can be obtained.

In other words, a phase reference point can be optimally set by appropriately setting the connection point of the balanced-side inductor L2 to the ground. Hence, a multilayer filter having a good balance characteristic can be realized. The optimum connection point to the ground can be determined by confirming that point through simulations, which are performed, e.g., in a design stage of the laminate 100A. Accordingly, the multilayer filter 10A having the good balance characteristic can be readily realized by appropriately determining the connection point based on the simulation results and by forming the laminate 100A with the use of the determined connection point.

Also, in the first preferred embodiment, the coil electrode 301A constituting the balanced-side inductor L2 and the coil electrodes 202A and 402A constituting the unbalanced-side inductor L1 are arranged opposite to each other in the stacking direction so as to establish electromagnetic coupling therebetween. With such an arrangement, the mutual inductance M can be easily set by adjusting the thickness of the dielectric layer and a matching degree between the overlapped coil electrodes when looking at the laminate 100A from above. Further, since those coil electrodes are arranged opposite to each other in the stacking direction, the size of the laminate 100A, as viewed from above, can be reduced.

By setting the balanced-side inductors L3 and L4 to the desired inductances in the arrangement of this first preferred embodiment, output impedances of the balanced signals can be set to the desired values. Moreover, since the winding directions of the balanced-side inductors L3, L2 and L4 are the same, a loss can be reduced and a filter having a smaller insertion loss can be constituted.

Since, in the arrangement of the first preferred embodiment, the first balanced-side capacitor C2 and the second balanced-side capacitor C3 are connected in series between the first balanced terminal Pb1 and the second balanced terminal Pb2 without being connected to the ground, a connection point between the first balanced-side capacitor C2 and the second balanced-side capacitor C3 serves as a floating ground, and phase balance is not affected by the pattern for connection to the ground and the mounted state of the multilayer filter 10A. Consequently, a more stable balance characteristic can be obtained.

By setting the first balanced-side capacitor C2 and the second balanced-side capacitor C3 to the desired element values, the phase balance between the balanced signals output from the first balanced terminal Pb1 and the second balanced terminal Pb2 can be designed to achieve the desired value.

By using one in the pair of opposed electrodes constituting each of the first balanced-side capacitor C2 and the second balanced-side capacitor C3 in a sharing way, a wiring pattern between the first balanced-side capacitor C2 and the second balanced-side capacitor C3 can be omitted. Therefore, stable phase balance can be realized and the size of the multilayer filter can be further reduced.

A multilayer filter according to a second preferred embodiment will be described below with reference to the drawings. A multilayer filter 10B of the second preferred embodiment preferably has the same circuit configuration as that of the multilayer filter 10A of the first preferred embodiment, and hence the description of the circuit configuration of the multilayer filter 10B is omitted.

Figure 5:
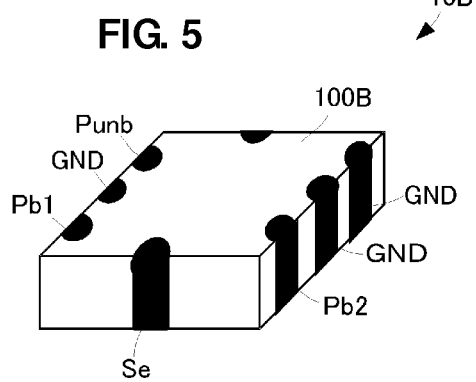
FIG. 5 is an external perspective view of a multilayer filter according to a second preferred embodiment of the present invention.
Figure 6:
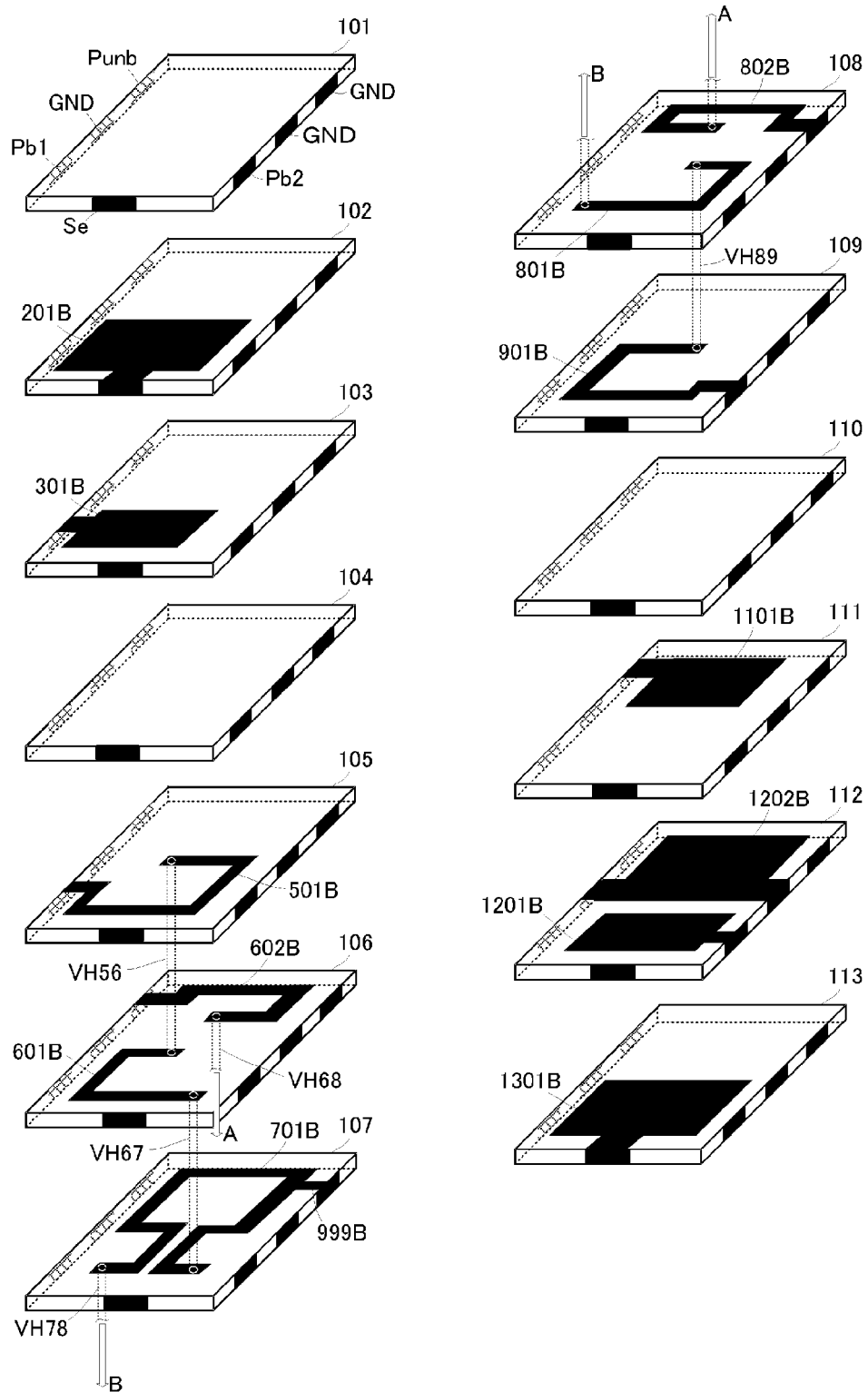
FIG. 6 is an exploded perspective view of the multilayer filter according to the second preferred embodiment of the present invention.

FIG. 5 is an external perspective view of the multilayer filter 10B according to the second preferred embodiment, and FIG. 6 is an exploded perspective view of the multilayer filter 10B according to the second preferred embodiment.

The multilayer filter 10B is realized with a laminate 100B preferably including thirteen dielectric layers 101 to 113, for example, stacked on each other.

As illustrated in FIG. 5, the laminate 100B is substantially parallelepiped in its external shape. An unbalanced terminal Punb, a ground terminal GND, and a first balanced terminal Pb1 are provided on a first lateral surface of the laminate 100B and are arranged in the order named. Two ground terminals GND and a second balanced terminal Pb2 are provided on a second lateral surface of the laminate 100B, which is positioned opposite to the first lateral surface thereof, and are arranged in the order named. In such a structure, the first balanced terminal Pb1 and the second balanced terminal Pb2 are arranged opposite to each other. Further, a connection electrode Se is provided on each of third and fourth lateral surfaces that are perpendicular to the first and second lateral surfaces. The connection electrode Se is a pattern that is used to connect predetermined inner layer electrodes (described later) to each other and that is not connected to any patterns for functional circuits on a mother board to which the multilayer filter 10B is mounted.

Only the above-mentioned group of outer terminals and a marking electrode are provided on the dielectric layer 101.

A plate electrode 201B having a substantially rectangular shape, as viewed from above, is provided on the dielectric layer 102. The plate electrode 201B is provided on the dielectric layer 102 over a predetermined area (about a half the surface of the dielectric layer 102 in the illustrated example) in a region on the side closer to the first balanced terminal Pb1 and the second balanced terminal Pb2. The plate electrode 201B is connected to the connection electrode Se.

A plate electrode 301B having a substantially rectangular shape, as viewed from above, is provided on the dielectric layer 103. The plate electrode 301B is located at a position opposite to the plate electrode 201B in the stacking direction. The plate electrode 301B is connected to the first balanced terminal Pb1 in the first lateral surface.

The plate electrode 201B in the dielectric layer 102, the plate electrode 301B in the dielectric layer 103, and the dielectric layer 102 interposed between the plate electrodes 201B and 301B constitute the first balanced-side capacitor C2.

No patterns for the inner layer electrodes are provided on the dielectric layer 104.

A coil electrode 501B is provided on the dielectric layer 105. One end of the coil electrode 501B is connected to the first balanced terminal Pb1 in the first lateral surface. The coil electrode 501B preferably has a coiled shape, as viewed from above, starting from the one end thereof. The other end of the coil electrode 501B is connected to one end of a coil electrode 601B in the dielectric layer 106 through an electroconductive via electrode VH56.

Coil electrodes 601B and 602B are provided on the dielectric layer 106. The one end of the coil electrode 601B is, as described above, connected to the other end of the coil electrode 501B through the via electrode VH56. The coil electrode 601B preferably has a coiled shape, as viewed from above, starting from the one end thereof. The coil electrode 601B is preferably arranged in the same winding direction as the coil electrode 501B. The coil electrodes 501B and 601B and the via electrode VH56 constitute the balanced-side inductor L3.

The other end of the coil electrode 601B is connected to one end of a coil electrode 701B in the dielectric layer 107 through an electroconductive via electrode VH67.

One end of the coil electrode 602B is connected to the unbalanced terminal Punb in the first lateral surface. The coil electrode 602B preferably has a coiled shape, as viewed from above, starting from the one end thereof. The other end of the coil electrode 602B is connected to one end of a coil electrode 802B in the dielectric layer 108 through an electroconductive via electrode VH68.

For electromagnetic coupling with the coil electrode 701B in the dielectric layer 107, the coil electrode 602B is located at a position where at least a portion thereof overlaps with the coil electrode 701B, when looking at the laminate from above.

The coil electrode 701B is provided on the dielectric layer 107. The one end of the coil electrode 701B is, as described above, connected to the other end of the coil electrode 601B through the via electrode VH67. The coil electrode 701B preferably has a coiled shape extending substantially over an entire surface of the dielectric layer 107, starting from the one end thereof. The other end of the coil electrode 701B is connected to one end of a coil electrode 801B in the dielectric layer 108 through an electroconductive via electrode VH78. The coil electrode 701B constitutes the balanced-side inductor L2.

In addition, the coil electrode 701B is connected at a predetermined position along the winding direction thereof to the ground terminal GND at an end of the second lateral surface through an electrode 999B for connection to the ground. The predetermined point of the balanced-side inductor L2 is thereby connected to the ground. As in the above-described first preferred embodiment, the position where the electrode 999B for connection to the ground is connected to the coil electrode 701B is determined such that the desired balance characteristic is obtained.

The coil electrodes 801B and 802B are provided on the dielectric layer 108. The one end of the coil electrode 802B is, as described above, connected to the other end of the coil electrode 602B through the via electrode VH68. The coil electrode 802B preferably has a coiled shape, starting from the one end thereof. The coil electrode 802B is preferably arranged to extend in the same winding direction as the coil electrode 602B, when looking at the laminate 100B from above. The other end of the coil electrode 802B is connected to the ground terminal GND at the end of the second lateral surface. The coil electrode 602B, the via electrode VH68, and the coil electrode 802B constitute the unbalanced-side inductor L1.

Like the coil electrode 602B, the coil electrode 802B is also located at a position where at least a portion thereof overlaps with the coil electrode 701B, when looking at the laminate from above, for electromagnetic coupling with the coil electrode 701B. With such an arrangement, the balanced-side inductor L2 and the unbalanced-side inductor L1 provide a mutual inductor M.

The one end of the coil electrode 801B is, as described above, connected to the other end of the coil electrode 701B through the via electrode VH78. The coil electrode 801B preferably has a coiled shape, starting from the one end thereof. The coil electrode 801B is preferably arranged to extend in the same winding direction as the coil electrodes 501B and 601B, when looking at the laminate 100B from above. The other end of the coil electrode 801B is connected to one end of a coil electrode 901B in the dielectric layer 109 through a via electrode VH89.

The coil electrode 901B is provided on the dielectric layer 109. The one end of the coil electrode 901B is, as described above, connected to the other end of the coil electrode 801B through the via electrode VH89. The coil electrode 901B preferably has a coiled shape, starting from the one end thereof. The coil electrode 901B is preferably arranged to extend in the same winding direction as the coil electrode 801B, when looking at the laminate 100B from above. The other end of the coil electrode 901B is connected to the second balanced terminal Pb2 in the second lateral surface. The coil electrode 801B, the via electrode VH89, and the coil electrode 901B constitute the balanced-side inductor L4.

No patterns for the inner layer electrodes are provided on the dielectric layer 110.

A plate electrode 1101B having a substantially rectangular shape, as viewed from above, is provided on the dielectric layer 111. The plate electrode 1101B is located in a region on the same side as the regions where the coil electrodes 602B and 802B constituting the unbalanced-side inductor L1 are formed, when looking at the laminate 100B from above, i.e., in a region overlapping with the coil electrodes 602B and 802B as viewed from above.

Plate electrodes 1201B and 1202B, each having a substantially rectangular shape as viewed from above, are provided on the dielectric layer 112. The plate electrode 1202B is located at a position opposite to the plate electrode 1101B in the stacking direction. With such an arrangement, the plate electrodes 1202B and 1101B and the dielectric layer 111 constitute an unbalanced-side capacitor C1. The plate electrode 1202B is connected to the ground terminal GND in the first lateral surface and to the ground terminal GND at a center of the second lateral surface. As a result, a resonance circuit including the unbalanced-side capacitor C1 and the unbalanced-side inductor L1 is provided.

The plate electrode 1201B is located in a region on the same side as the regions where the coil electrodes 501B, 601B, 801B and 901B constituting the balanced-side inductors L3 and L4 are formed, when looking at the laminate 100B from above, i.e., in a region overlapping with the coil electrodes 501B, 601B, 801B and 901B as viewed from above. The plate electrode 1201B is connected to the second balanced terminal Pb2 in the second lateral surface.

A plate electrode 1301B having a substantially rectangular shape, as viewed from above, is provided on the dielectric layer 113. The plate electrode 1301B is arranged in opposing relation to the plate electrode 1201B in the stacking direction. The plate electrode 1301B is connected to the connection electrode Se.

The plate electrode 1201B in the dielectric layer 112, the plate electrode 1301B in the dielectric layer 113, and the dielectric layer 112 interposed between the plate electrodes 1201B and 1301B constitute the second balanced-side capacitor C3.

The above-described arrangement can also realize the multilayer filter 10B having the stable balance characteristic, as in the above-described first preferred embodiment, because the coil electrode 701B constituting the balanced-side inductor L2 is connected at its appropriate position to the ground.

Also, by setting the balanced-side inductors L3 and L4 to the desired inductances in the arrangement of this second preferred embodiment, output impedances of the balanced signals can be set to the desired values. Moreover, since the winding directions of the balanced-side inductors L3, L2 and L4 are the same, a loss can be reduced and a filter having a smaller insertion loss can be constituted.

Further, since the first balanced-side capacitor C2 and the second balanced-side capacitor C3 are arranged to be aligned in the stacking direction in this second preferred embodiment, the size of the multilayer filter in its plan shape can be reduced in comparison with that in the above-described first preferred embodiment when the first balanced-side capacitor C2 and the second balanced-side capacitor C3 are set to the same capacitances as those in the above-described first preferred embodiment. Stated another way, when the multilayer filter is configured in plan shape having the same size, larger capacitances can be realized with the second preferred embodiment.

A multilayer filter according to a third preferred embodiment will be described below with reference to the drawings. A multilayer filter 10C of this third preferred embodiment is constituted by adding, to the multilayer filter 10A of the first preferred embodiment, a DC feed terminal Pdc and a capacitor Cg for grounding.

Figure 7:
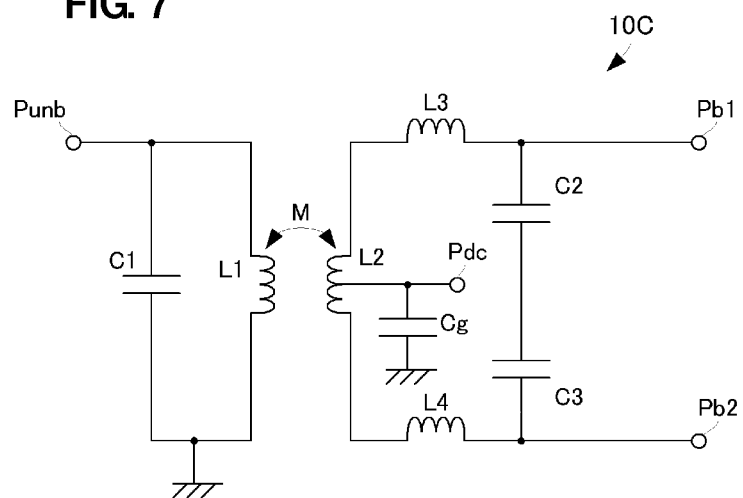
FIG. 7 is a circuit diagram of a multilayer filter according to a third preferred embodiment of the present invention.

FIG. 7 is a circuit diagram of the multilayer filter 10C according to the third preferred embodiment. In the multilayer filter 10C, as illustrated in FIG. 7, the DC feed terminal Pdc is connected to a midpoint of the balanced-side inductor L2. A line connecting the DC feed terminal Pdc and the balanced-side inductor L2 is connected to the ground through the capacitor Cg. The other arrangement is similar to that in the multilayer filter 10A of the first preferred embodiment, and hence the detailed description of the circuit configuration is omitted here.

Figure 8:
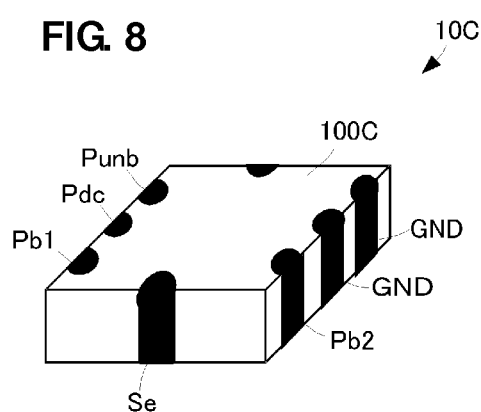
FIG. 8 is an external perspective view of the multilayer filter according to the third preferred embodiment of the present invention.

FIG. 8 is an external perspective view of the multilayer filter 10C according to the third preferred embodiment. As illustrated in FIG. 8, a laminate 100C constituting the multilayer filter 10C is substantially parallelepiped in its external shape. An unbalanced terminal Punb, an outer electrode for the DC feed terminal Pdc (the outer electrode being also hereinafter referred to as the "DC feed terminal Pdc"), and a first balanced terminal Pb1 are provided on a first lateral surface of the laminate 100C and are arranged in the order named. Two ground terminals GND and a second balanced terminal Pb2 are provided on a second lateral surface of the laminate 100C, which is positioned opposite to the first lateral surface thereof, and are arranged in the order named. In such a structure, the first balanced terminal Pb1 and the second balanced terminal Pb2 are arranged opposite to each other. Further, a connection electrode Se is provided on each of third and fourth lateral surfaces that are perpendicular to the first and second lateral surfaces. The connection electrode Se is a pattern that is used to connect predetermined inner layer electrodes (described later) to each other and that is not connected to any patterns for functional circuits on a mother board to which the multilayer filter 10C is mounted.

Figure 9:
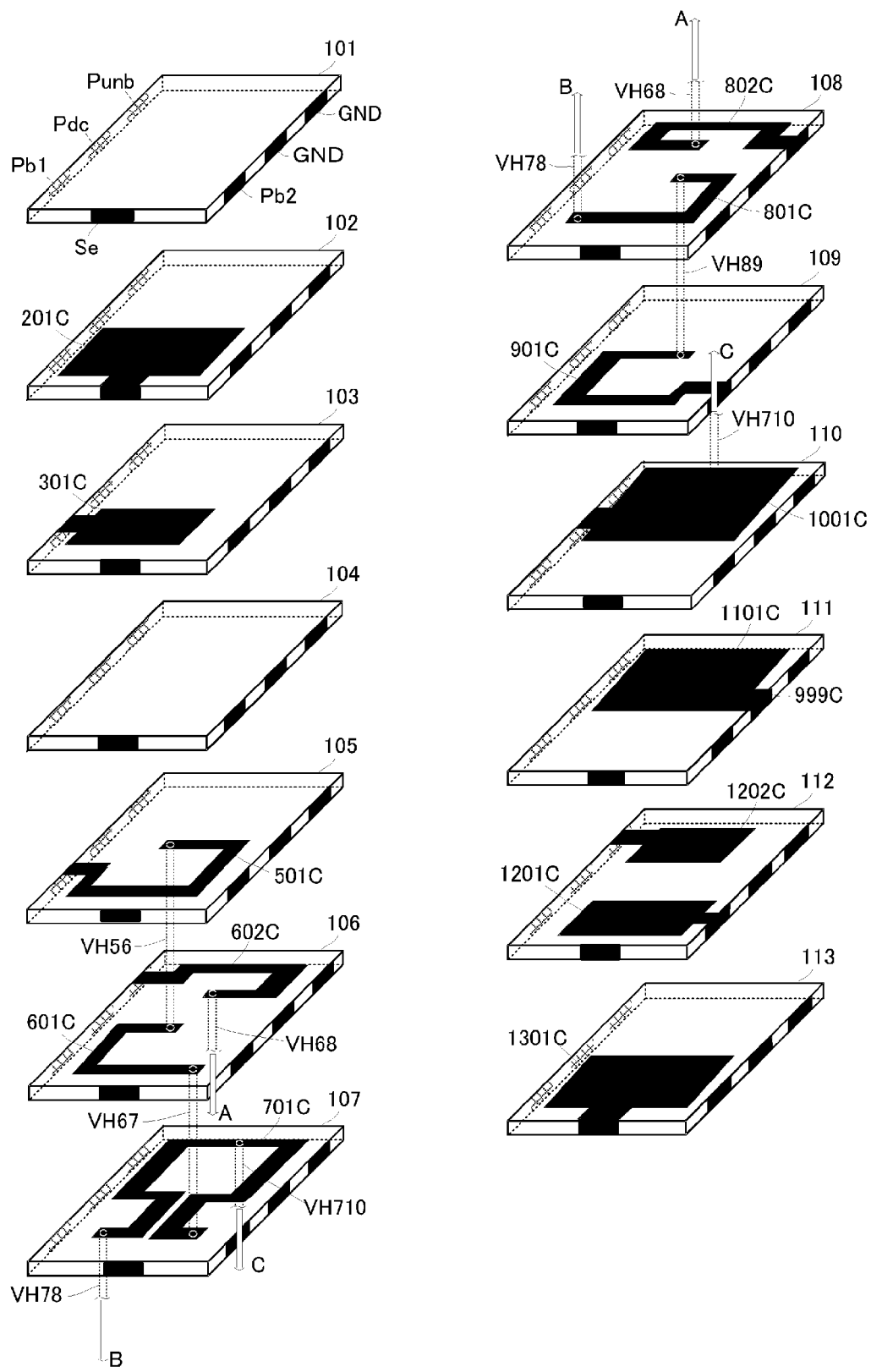
FIG. 9 is an exploded perspective view of the multilayer filter according to the third preferred embodiment of the present invention.

FIG. 9 is an exploded perspective view of the multilayer filter 10C according to the third preferred embodiment. The multilayer filter 10C is realized with the laminate 100C that includes thirteen dielectric layers 101 to 113, for example, stacked on each other.

Only the above-mentioned group of outer terminals and a marking electrode are provided on the dielectric layer 101.

A plate electrode 201C having a substantially rectangular shape, as viewed from above, is provided on the dielectric layer 102. The plate electrode 201C is provided on the dielectric layer 102 over a predetermined area (about a half the surface of the dielectric layer 102 in the illustrated example) in a region on the side closer to the first balanced terminal Pb1 and the second balanced terminal Pb2. The plate electrode 201C is connected to the connection electrode Se.

A plate electrode 301C having a substantially rectangular shape, as viewed from above, is provided on the dielectric layer 103. The plate electrode 301C is located at a position opposite to the plate electrode 201C in the stacking direction. The plate electrode 301C is connected to the first balanced terminal Pb1 in the first lateral surface.

The plate electrode 201C in the dielectric layer 102, the plate electrode 301C in the dielectric layer 103, and the dielectric layer 102 interposed between the plate electrodes 201C and 301C constitute the first balanced-side capacitor C2.

No patterns for the inner layer electrodes are provided on the dielectric layer 104.

A coil electrode 501C is provided on the dielectric layer 105. One end of the coil electrode 501C is connected to the first balanced terminal Pb1 in the first lateral surface. The coil electrode 501C preferably has a coiled shape, as viewed from above, starting from the one end thereof. The other end of the coil electrode 501C is connected to one end of a coil electrode 601C in the dielectric layer 106 through an electroconductive via electrode VH56.

Coil electrodes 601C and 602C are provided on the dielectric layer 106. The one end of the coil electrode 601C is, as described above, connected to the other end of the coil electrode 501C through the via electrode VH56. The coil electrode 601C preferably has a coiled shape, as viewed from above, starting from the one end thereof. The coil electrode 601C is preferably arranged to extend in the same winding direction as the coil electrode 501C. The coil electrodes 501C and 601C and the via electrode VH56 constitute the balanced-side inductor L3.

The other end of the coil electrode 601C is connected to one end of a coil electrode 701C in the dielectric layer 107 through an electroconductive via electrode VH67.

One end of the coil electrode 602C is connected to the unbalanced terminal Punb in the first lateral surface. The coil electrode 602C preferably has a coiled shape, as viewed from above, starting from the one end thereof. The other end of the coil electrode 602C is connected to one end of a coil electrode 802C in the dielectric layer 108 through an electroconductive via electrode VH68.

The coil electrode 602C is located at a position where it is electromagnetically coupled with the coil electrode 701C in the dielectric layer 107.

The coil electrode 701C is provided on the dielectric layer 107. The one end of the coil electrode 701C is, as described above, connected to the other end of the coil electrode 601C through the via electrode VH67. The coil electrode 701C preferably has a coiled shape extending substantially over an entire surface of the dielectric layer 107, starting from the one end thereof. The other end of the coil electrode 701C is connected to one end of a coil electrode 801C in the dielectric layer 108 through an electroconductive via electrode VH78. The coil electrode 701C constitutes the balanced-side inductor L2.

Further, the coil electrode 701C is connected at a predetermined position along the winding direction thereof to a plate electrode 1001C in the dielectric layer 110 through a via electrode VH710. As described later, the plate electrode 1001C serves as one of opposed electrodes constituting the capacitor Cg, and a plate electrode 1101C serving as the other of the opposed electrodes constituting the capacitor Cg is connected to the ground terminal GND in the second lateral surface. The predetermined position of the coil electrode 701C is thereby connected to the ground through the capacitor Cg. Accordingly, by appropriately setting the position where the coil electrode 701C is connected to the via electrode VH710, as in the above-described preferred embodiments, an optimum phase reference point for the balanced-side inductor L2 can be set and the stable balance characteristic can be obtained.

The coil electrodes 801C and 802C are provided on the dielectric layer 108. The one end of the coil electrode 802C is, as described above, connected to the other end of the coil electrode 602C through the via electrode VH68. The coil electrode 802C preferably has a coiled shape, starting from the one end thereof. The coil electrode 802C is preferably arranged to extend in the same winding direction as the coil electrode 602C, when looking at the laminate 100C from above. The other end of the coil electrode 802C is connected to the ground terminal GND at an end of the second lateral surface. The coil electrode 602C, the via electrode VH68, and the coil electrode 802C constitute the unbalanced-side inductor L1.

Like the coil electrode 602C, the coil electrode 802C is also located at a position where it is electromagnetically coupled with the coil electrode 701C. With such an arrangement, the balanced-side inductor L2 and the unbalanced-side inductor L1 provide a mutual inductor M.

The one end of the coil electrode 801C is, as described above, connected to the other end of the coil electrode 701C through the via electrode VH78. The coil electrode 801C preferably has a coiled shape, starting from the one end thereof. The coil electrode 801C is preferably arranged to extend in the same winding direction as the coil electrodes 501C and 601C, when looking at the laminate 100C from above. The other end of the coil electrode 801C is connected to one end of a coil electrode 901C in the dielectric layer 109 through a via electrode VH89.

The coil electrode 901C is provided on the dielectric layer 109. The one end of the coil electrode 901C is, as described above, connected to the other end of the coil electrode 801C through the via electrode VH89. The coil electrode 901C preferably has a coiled shape, starting from the one end thereof. The coil electrode 901C is preferably arranged to extend in the same winding direction as the coil electrode 801C, when looking at the laminate 100C from above. The other end of the coil electrode 901C is connected to the second balanced terminal Pb2 in the second lateral surface. The coil electrode 801C, the via electrode VH89, and the coil electrode 901C constitute the balanced-side inductor L4.

A plate electrode 1001C having a substantially rectangular shape, as viewed from above, is provided on the dielectric layer 110. The plate electrode 1001C is provided on a region on the same side as the regions where the coil electrodes constituting the unbalanced-side inductor L1 are located, when looking at the laminate 100C from above. The plate electrode 1001C is connected to the DC feed terminal Pdc in the first lateral surface.

A plate electrode 1101C having a substantially rectangular shape, as viewed from above, is provided on the dielectric layer 111. The plate electrode 1101C is located in a region on the same side as the regions where the coil electrodes constituting the unbalanced-side inductor L1 are located, when looking at the laminate 100C from above. The plate electrode 1101C is arranged at a position opposite to the plate electrode 1001C in the stacking direction. The plate electrode 1101C is connected to the ground terminal GND in the second lateral surface through an electrode 999C for connection to the ground. The plate electrodes 1001C and 1101C and the dielectric layer 110 constitute the capacitor Cg for grounding. The capacitor Cg can remove high-frequency components of a signal passing through the DC feed terminal Pdc.

Plate electrodes 1201C and 1202C, each having a substantially rectangular shape as viewed from above, are provided on the dielectric layer 112. The plate electrode 1202C is arranged at a position opposite to the plate electrode 1101C in the stacking direction. With such an arrangement, the plate electrodes 1202C and 1101C and the dielectric layer 111 constitute the unbalanced-side capacitor C1. The plate electrode 1202C is connected to the unbalanced terminal Punb in the first lateral surface. The resonance circuit including the unbalanced-side capacitor C1 and the unbalanced-side inductor L1 is thus provided.

The plate electrode 1201C is located in a region on the same side as the regions where the coil electrodes constituting the balanced-side inductors L3 and L4 are located, when looking at the laminate 100C from above. The plate electrode 1201C is connected to the second balanced terminal Pb2 in the second lateral surface.

A plate electrode 1301C having a substantially rectangular shape, as viewed from above, is provided on the dielectric layer 113. The plate electrode 1301C is arranged in opposing relation to the plate electrode 1201C in the stacking direction. The plate electrode 1301C is connected to the connection electrode Se.

The plate electrode 1201C in the dielectric layer 112, the plate electrode 1301C in the dielectric layer 113, and the dielectric layer 112 interposed between the plate electrodes 1201C and 1301C constitute the second balanced-side capacitor C3.

With the arrangement described above, the third preferred embodiment including the DC feed terminal Pdc can also provide advantageous effects that are similar to those in the above-described second preferred embodiment.

Also, with the arrangement of the third preferred embodiment, a bias voltage on the balanced output side can be set while removing the high-frequency components of the signal that is input through the DC feed terminal Pdc.

Further, by setting the balanced-side inductors L3 and L4 to the desired inductances in the arrangement of this third preferred embodiment, output impedances of the balanced signals can be set to the desired values. Moreover, since the winding directions of the balanced-side inductors L3, L2 and L4 are the same, a loss can be reduced and a filter having a smaller insertion loss can be provided.

A multilayer filter according to a fourth preferred embodiment will be described below with reference to the drawings. While the above-described preferred embodiments represent the case where one balance filter circuit is preferably provided on one laminate, the following preferred embodiments represent the case where two balance filter circuits are preferably provided on one laminate.

Figure 10:
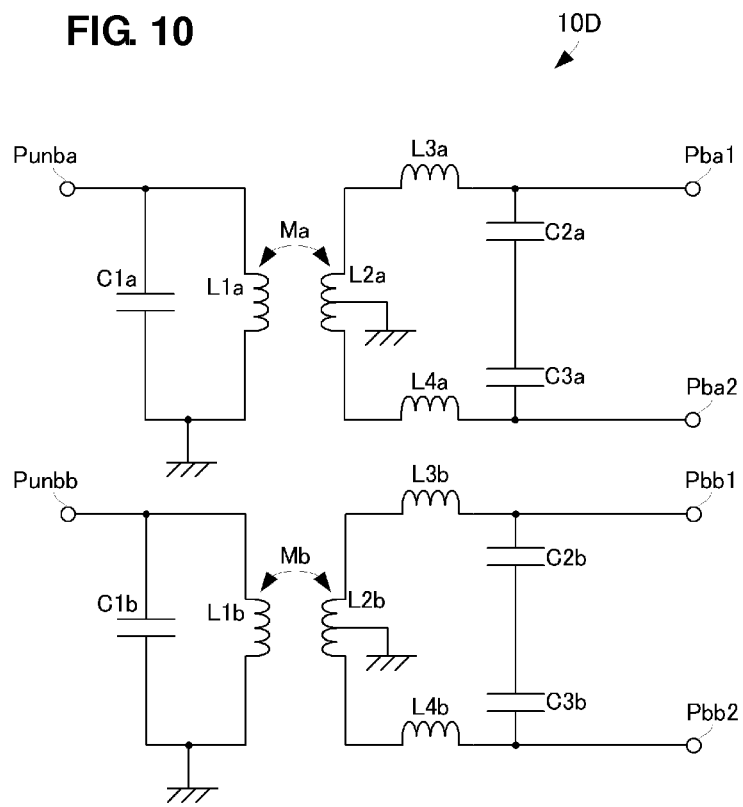
FIG. 10 is a circuit diagram of a multilayer filter according to a fourth preferred embodiment of the present invention.

FIG. 10 is a circuit diagram of a multilayer filter 10D according to the fourth preferred embodiment. As illustrated in FIG. 10, in the multilayer filter 10D of the fourth preferred embodiment, two of the filter circuits according to the first preferred embodiment, illustrated in FIG. 1, are provided on one laminate.

A first filter circuit constituting the multilayer filter 10D includes an unbalanced terminal Punba to input and output an unbalanced signal, and a first balanced terminal Pba1 and a second balanced terminal Pba2 to input and output balanced signals.

A parallel resonance circuit including an unbalanced-side capacitor C1a and an unbalanced-side inductor L1a is connected between the unbalanced terminal Punba and the ground.

Three balanced-side inductors L3a, L2a and L4a are connected in series between the first balanced terminal Pba1 and the second balanced terminal Pba2. The balanced-side inductors L3a, L2a and L4a are connected in the order named, i.e., in the order of the balanced-side inductors L3a, L2a and L4a, looking from the first balanced terminal Pba1. As described later, the balanced-side inductors L3a, L2a and L4a are provided by substantially helical coils having the same winding direction. While three balanced-side inductors are preferably used in the illustrated preferred embodiment, the number of balanced-side inductors may be some other suitable value as long as it is an odd value except for one.

The balanced-side inductor L2a is arranged to be electromagnetically coupled with the unbalanced-side inductor L1a. Such an arrangement causes a mutual inductor Ma to act between the balanced-side inductor L2a and the unbalanced-side inductor L1a. The balanced-side inductor L2a is connected at a predetermined point thereof to the ground.

A serial circuit including a first balanced-side capacitor C2a and a second balanced-side capacitor C3a is connected between the first balanced terminal Pba1 and the second balanced terminal Pba2. The first balanced-side capacitor C2a and the second balanced-side capacitor C3a are connected in the order named, i.e., in the order of the first and second balanced-side capacitor C2a and C3a, looking from the first balanced terminal Pba1.

A second filter circuit constituting the multilayer filter 10D includes an unbalanced terminal Punbb to input and to output an unbalanced signal, and a first balanced terminal Pbb1 and a second balanced terminal Pbb2 to input and to output balanced signals.

A parallel resonance circuit including an unbalanced-side capacitor C1b and an unbalanced-side inductor L1b is connected between the unbalanced terminal Punbb and the ground.

Three balanced-side inductors L3b, L2b and L4b are connected in series between the first balanced terminal Pbb1 and the second balanced terminal Pbb2. The balanced-side inductors L3b, L2b and L4b are connected in the order named, i.e., in the order of the balanced-side inductors L3b, L2b and L4b, looking from the first balanced terminal Pbb1. As described later, the balanced-side inductors L3b, L2b and L4b are provided by substantially helical coils having the same winding direction. While three balanced-side inductors are preferably included in the illustrated preferred embodiment, the number of balanced-side inductors may be some other suitable value as long as it is an odd value except for one.

The balanced-side inductor L2b is arranged to be electromagnetically coupled with the unbalanced-side inductor L1b. Such an arrangement causes a mutual inductor Mb to act between the balanced-side inductor L2b and the unbalanced-side inductor L1b. The balanced-side inductor L2b is connected at a predetermined point thereof to the ground.

A serial circuit including a first balanced-side capacitor C2b and a second balanced-side capacitor C3b is connected between the first balanced terminal Pbb1 and the second balanced terminal Pbb2. The first balanced-side capacitor C2b and the second balanced-side capacitor C3b are connected in the order named, i.e., in the order of the first and second balanced-side capacitor C2b and C3b, looking from the first balanced terminal Pbb1.

Figure 11:
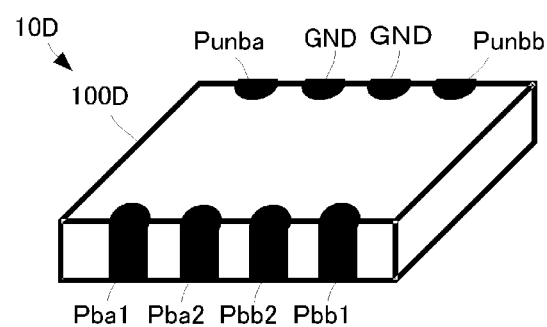
FIG. 11 is an external perspective view of the multilayer filter according to the fourth preferred embodiment of the present invention.
Figure 12:
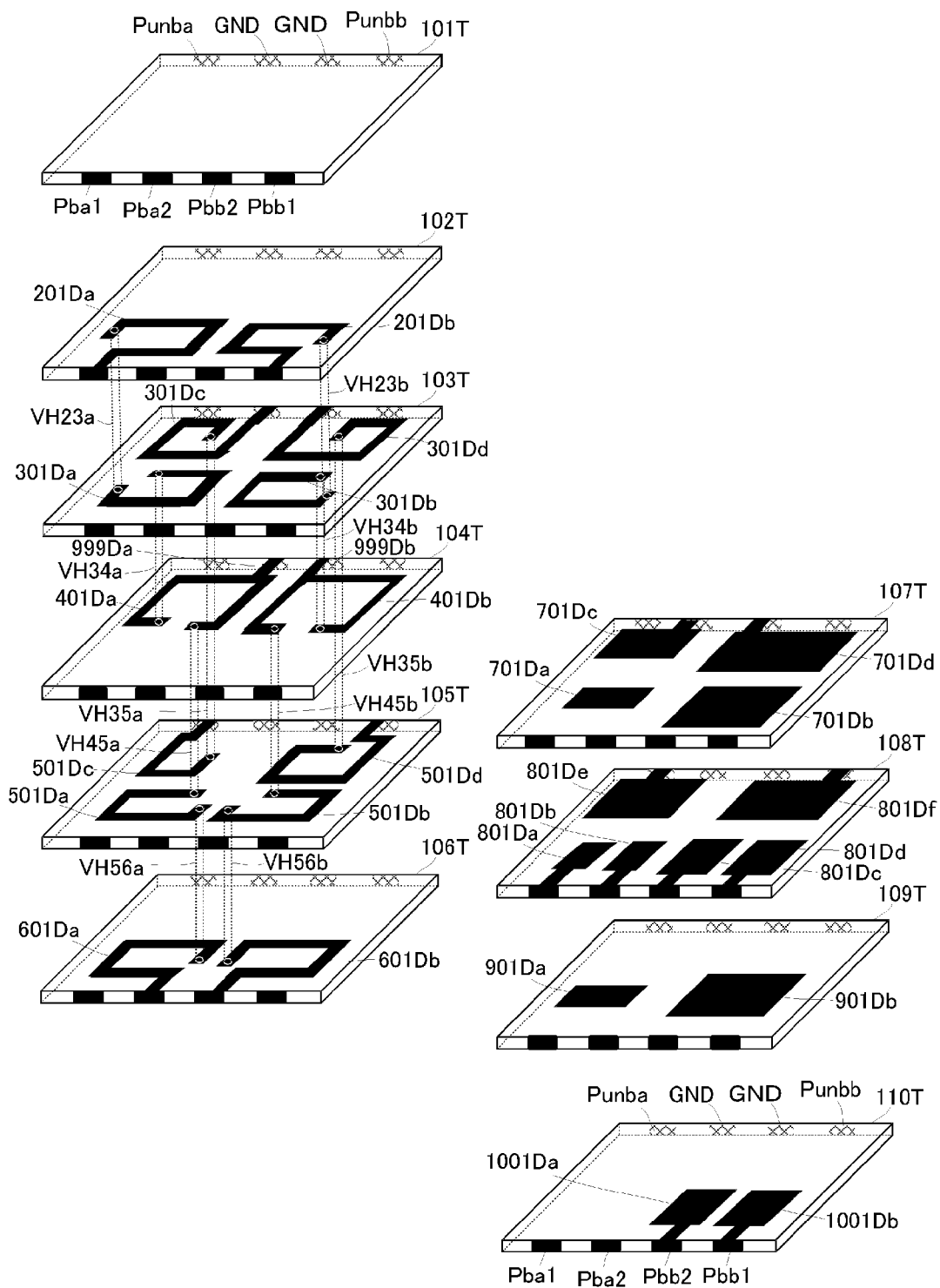
FIG. 12 is an exploded perspective view of the multilayer filter according to the fourth preferred embodiment of the present invention.

A structure of the multilayer filter 10D having the above-described circuit configuration will be described below. FIG. 11 is an external perspective view of the multilayer filter 10D according to the fourth preferred embodiment, and FIG. 12 is an exploded perspective view of the multilayer filter 10D according to the fourth preferred embodiment.

The circuit elements constituting the first filter circuit and the circuit elements constituting the second filter circuit are located in separate regions, when looking at the laminate 100D from above, so that the circuit elements of the first and second filter circuits are not coupled with each other in a high-frequency range. Further, winding directions of inductors are reversed between the first and second filter circuits, as seen from FIG. 12 in which the winding directions in a practical example are illustrated. Such a structure can prevent and minimize coupling between the first filter circuit and the second filter circuit.

The multilayer filter 10D is realized with a laminate 100D that preferably includes ten dielectric layers 101T to 110T, for example, stacked on each other.

As illustrated in FIG. 11, the laminate 100D preferably is substantially parallelepiped in its external shape. An outer electrode for the unbalanced terminal (hereinafter referred to as the "unbalanced terminal Punba") of the first filter circuit, ground electrodes (hereinafter referred to as "ground terminals GND"), and an outer electrode for the unbalanced terminal (hereinafter referred to as the "unbalanced terminal Punbb") of the second filter circuit are provided in a first lateral surface of the laminate 100D and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are provided in a second lateral surface of the laminate 100D, which is positioned opposite to the first lateral surface, and are arranged in the order named. In such a structure, the unbalanced terminal Punba and the first balanced terminal Pba1 of the first filter circuit are arranged opposite to each other. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100D. Though not illustrated, a marking electrode that is used to determine the mounting direction is preferably provided on an upper surface of the dielectric layer 101T, i.e., on a top surface of the laminate 100D.

Coil electrodes 201Da and 201Db are provided on the dielectric layer 102T. One end of the coil electrode 201Da is connected to the first balanced terminal Pba1 of the first filter circuit in the second lateral surface. The coil electrode 201Da preferably has a coiled shape, as viewed from above, starting from the one end thereof. The other end of the coil electrode 201Da is connected to one end of a coil electrode 301Da in the dielectric layer 103T through an electroconductive via electrode VH23a.

One end of the coil electrode 201Db is connected to the first balanced terminal Pbb1 of the second filter circuit in the second lateral surface. The coil electrode 201Db preferably has a coiled shape, as viewed from above, starting from the one end thereof. The other end of the coil electrode 201Db is connected to one end of a coil electrode 301Db in the dielectric layer 103T through an electroconductive via electrode VH23b.

Coil electrodes 301Da, 301Db, 301Dc and 301Dd are provided on the dielectric layer 103T.

The one end of the coil electrode 301Da is connected to the other end of the coil electrode 201Da through the via electrode VH23a. The coil electrode 301Da preferably has a coiled shape preferably extending in the same winding direction as the coil electrode 201Da, as viewed from above, starting from the one end thereof. The other end of the coil electrode 301Da is connected to one end of a coil electrode 401Da in the dielectric layer 104T through an electroconductive via electrode VH34a. The coil electrode 301Da, the coil electrode 201Da, and the via electrode VH23a constitute the balanced-side inductor L3a of the first filter circuit.

The one end of the coil electrode 301Db is connected to the other end of the coil electrode 201Db through the via electrode VH23b. The coil electrode 301Db preferably has a coiled shape preferably extending in the same winding direction as the coil electrode 201Db, as viewed from above, starting from the one end thereof. The other end of the coil electrode 301Db is connected to one end of a coil electrode 401Db in the dielectric layer 104T through an electroconductive via electrode VH34b. The coil electrode 301Db, the coil electrode 201Db, and the via electrode VH23b constitute the balanced-side inductor L3b of the second filter circuit.

One end of the coil electrode 301Dc is connected to the ground terminal GND of the first filter circuit in the first lateral surface. The coil electrode 301Dc preferably has a coiled shape, as viewed from above, starting from the one end thereof. The other end of the coil electrode 301Dc is connected to one end of a coil electrode 501Dc in the dielectric layer 105T through an electroconductive via electrode VH35a.

One end of the coil electrode 301Dd is connected to the ground terminal GND of the second filter circuit in the first lateral surface. The coil electrode 301Dd preferably has a coiled shape, as viewed from above, starting from the one end thereof. The other end of the coil electrode 301Dd is connected to one end of a coil electrode 501Dd in the dielectric layer 105T through an electroconductive via electrode VH35b.

The coil electrodes 401Da and 401Db are provided on the dielectric layer 104T. The one end of the coil electrode 401Da is connected to the other end of the coil electrode 301Da through the via electrode VH34a. The coil electrode 401Da preferably has a coiled shape such that at least a portion thereof overlaps with the coil electrode 301Dc, as viewed from above, for electromagnetic coupling with the coil electrode 301Dc. The other end of the coil electrode 401Da is connected to one end of a coil electrode 501Da in the dielectric layer 105T through a via electrode VH45a. The coil electrode 401Da constitutes the balanced-side inductor L2a of the first filter circuit.

Further, the coil electrode 401Da is connected at a predetermined position along the winding direction thereof to the ground terminal GND in the first lateral surface through an electrode 999Da for connection to the ground. The position where the electrode 999Da for connection to the ground is connected to the coil electrode 401Da is also appropriately set, as in the above-described preferred embodiments, by setting an optimum phase reference point such that the predetermined balance characteristic can be obtained at the set position.

The one end of the coil electrode 401Db is connected to the other end of the coil electrode 301Db through the via electrode VH34b. The coil electrode 401Db preferably has a coiled shape such that at least a portion thereof overlaps with the coil electrode 301Dd, as viewed from above, for electromagnetic coupling with the coil electrode 301Dd. The other end of the coil electrode 401Db is connected to one end of a coil electrode 501Db in the dielectric layer 105T through a via electrode VH45b. The coil electrode 401Db constitutes the balanced-side inductor L2b of the second filter circuit.

Further, the coil electrode 401Db is connected at a predetermined position along the winding direction thereof to the ground terminal GND in the first lateral surface through an electrode 999Db for connection to the ground. The position where the electrode 999Db for connection to the ground is connected to the coil electrode 401Db is also appropriately set, as in the above-described preferred embodiments, by setting an optimum phase reference point such that the predetermined balance characteristic can be obtained at the set position.

The coil electrodes 501Da, 501Db, 501Dc and 501Dd are provided on the dielectric layer 105T.

The one end of the coil electrode 501Da is connected to the other end of the coil electrode 401Da through the via electrode VH45a. The coil electrode 501Da preferably has a coiled shape, as viewed from above, starting from the one end thereof. The coil electrode 501Da is located in a region on the side closer to the first and second balanced terminals Pba1 and Pba2 of the first filter circuit, i.e., in a region overlapping with the coil electrodes 201Da and 301Da, when looking at the laminate 100D from above. The other end of the coil electrode 501Da is connected to one end of a coil electrode 601Da in the dielectric layer 106T through a via electrode VH56a.

The one end of the coil electrode 501Db is connected to the other end of the coil electrode 401Db through the via electrode VH45b. The coil electrode 501Db preferably has a coiled shape, as viewed from above, starting from the one end thereof. The coil electrode 501Db is located in a region on the side closer to the first and second balanced terminals Pbb1 and Pbb2 of the second filter circuit, i.e., in a region overlapping with the coil electrodes 201Db and 301Db, when looking at the laminate 100D from above. The other end of the coil electrode 501Db is connected to one end of a coil electrode 601Db in the dielectric layer 106T through a via electrode VH56b.

The one end of the coil electrode 501Dc is connected to the other end of the coil electrode 301Dc through the via electrode VH35a. The coil electrode 501Dc preferably has a coiled shape preferably extending in the same winding direction as the coil electrode 301Dc, as viewed from above, starting from the one end thereof. Further, the coil electrode 501Dc is located at a position where at least a portion thereof overlaps with the coil electrode 401Da, when looking at the laminate from above, for electromagnetic coupling with the coil electrode 401Da. The other end of the coil electrode 501Dc is connected to the unbalanced terminal Punba of the first filter circuit. The coil electrode 501Dc, the coil electrode 301Dc, and the via electrode VH35a constitute the unbalanced-side inductor L1a of the first filter circuit.

The one end of the coil electrode 501Dd is connected to the other end of the coil electrode 301Dd through the via electrode VH35b. The coil electrode 501Dd preferably has a coiled shape preferably extending in the same winding direction as the coil electrode 301Dd, as viewed from above, starting from the one end thereof. The coil electrode 501Dd is also located at a position where at least a portion thereof overlaps with the coil electrode 401Db, when looking at the laminate from above, for electromagnetic coupling with the coil electrode 401Db. The other end of the coil electrode 501Dd is connected to the unbalanced terminal Punbb of the second filter circuit. The coil electrode 501Dd, the coil electrode 301Dd, and the via electrode VH35b constitute the unbalanced-side inductor L1b of the second filter circuit.

The coil electrodes 601Da and 601Db are provided on the dielectric layer 106T. The one end of the coil electrode 601Da is connected to the other end of the coil electrode 501Da through the via electrode VH56a. The coil electrode 601Da preferably has a coiled shape preferably extending in the same winding direction as the coil electrode 501Da, as viewed from above, starting from the one end thereof. The coil electrode 601Da, the coil electrode 501Da, and the via electrode VH56a constitute the balanced-side inductor L4a of the first filter circuit.

The one end of the coil electrode 601Db is connected to the other end of the coil electrode 501Db through the via electrode VH56b. The coil electrode 601Db preferably has a coiled shape preferably extending in the same winding direction as the coil electrode 501Db, as viewed from above, starting from the one end thereof. The coil electrode 601Db, the coil electrode 501Db, and the via electrode VH56b constitute the balanced-side inductor L4b of the second filter circuit.

Plate electrodes 701Da, 701Db, 701Dc and 701Dd, each having a predetermined area and having a substantially rectangular shape as viewed from above, are provided on the dielectric layer 107T.

The plate electrode 701Dc is located in a region on the side closer to the unbalanced terminal Punba of the first filter circuit, when looking at the laminate 100D from above. In other words, the plate electrode 701Dc is located in a region substantially matching with the regions where the coil electrodes 301Dc and 501Dc are located, when looking at the laminate 100D from above. The plate electrode 701Dc is connected to the ground terminal GND in the first lateral surface.

The plate electrode 701Dd is located in a region on the side closer to the unbalanced terminal Punbb of the second filter circuit, when looking at the laminate 100D from above. In other words, the plate electrode 701Dd is located in a region substantially matching with the regions where the coil electrodes 301Dd and 501Dd are located, when looking at the laminate 100D from above. The plate electrode 701Dd is connected to the ground terminal GND in the first lateral surface.

The plate electrode 701Da is located in a region on the side closer to the first and second balanced terminals Pba1 and Pba2 of the first filter circuit, when looking at the laminate 100D from above. The plate electrode 701Da is a floating electrode that is not connected to any outer terminals including the ground terminal GND.

The plate electrode 701Db is located in a region on the side closer to the first and second balanced terminals Pbb1 and Pbb2 of the second filter circuit, when looking at the laminate 100D from above. The plate electrode 701Db is a floating electrode that is not connected to any outer terminals including the ground terminal GND.

Plate electrodes 801Da, 801Db, 801Dc, 801Dd, 801De and 801Df, each having a predetermined area and having a substantially rectangular shape as viewed from above, are provided on the dielectric layer 108T.

The plate electrode 801De is arranged in opposing relation to the plate electrode 701Dc in the stacking direction, i.e., when looking at the laminate 100D from above. The plate electrodes 801De and 701Dc and the dielectric layer 107T constitute the unbalanced-side capacitor C1a of the first filter circuit.

The plate electrode 801Df is arranged in opposing relation to the plate electrode 701Dd in the stacking direction, i.e., when looking at the laminate 100D from above. The plate electrodes 801Df and 701Dd and the dielectric layer 107T constitute the unbalanced-side capacitor C1b of the second filter circuit.

The plate electrodes 801Da and 801Db are each arranged in opposing relation to the plate electrode 701Da in the stacking direction. The plate electrodes 801Dc and 801Dd are each arranged in opposing relation to the plate electrode 701Db in the stacking direction.

Plate electrodes 901Da and 901Db, each having a predetermined area and having a substantially rectangular shape as viewed from above, are provided on the dielectric layer 109T. The plate electrode 901Da is arranged in opposing relation to the plate electrodes 801Da and 801Db in the stacking direction. The plate electrodes 901Da, 801Da and 701Da and the dielectric layers 107T and 108T constitute the first balanced-side capacitor C2a of the first filter circuit. The plate electrodes 901Da, 801Db and 701Da and the dielectric layers 107T and 108T constitute the second balanced-side capacitor C3a of the first filter circuit.

The plate electrode 901Db is arranged in opposing relation to the plate electrodes 801Dc and 801Dd in the stacking direction.

Plate electrodes 1001Da and 1001Db, each having a predetermined area and having a substantially rectangular shape as viewed from above, are provided on the dielectric layer 110T. The plate electrodes 1001Da and 1001Db are each arranged in opposing relation to the plate electrode 901Db in the stacking direction.

The plate electrodes 701Db, 801Dc, 901Db and 1001Da and the dielectric layers 107T, 108T and 109T constitute the second balanced-side capacitor C3b of the second filter circuit. The plate electrodes 701Db, 801Dd, 901Db and 1001Db and the dielectric layers 107T, 108T and 109T constitute the first balanced-side capacitor C2b of the second filter circuit.

The plate electrode 1001Da is connected to the second balanced terminal Pbb2 of the second filter circuit. The plate electrode 1001Db is connected to the first balanced terminal Pbb1 of the second filter circuit.

With the above-described arrangement of this fourth preferred embodiment, even when a plurality of filter circuits are provided in one laminate, it is possible, as in the above-described preferred embodiments, to set an optimum phase reference point for each filter circuit, and to realize the multilayer filter having the stable balance characteristic.

Further, by setting the balanced-side inductors L3a and L4a of the first filter circuit and the balanced-side inductors L3b and L4b of the second filter circuit to the desired inductances in the arrangement of this fourth preferred embodiment, output impedances of the balanced signals can be set to the desired values. Moreover, since the winding directions of the balanced-side inductors L3a, L2a and L4a of the first filter circuit and the winding directions of the balanced-side inductors L3b, L2b and L4b of the second filter circuit are the same, a loss in each filter circuit can be reduced and a filter having a smaller insertion loss can be provided.

A multilayer filter according to a fifth preferred embodiment will be described below with reference to the drawings. A multilayer filter 10E of this fifth preferred embodiment is constituted preferably by modifying the multilayer filter 10D of the fourth preferred embodiment such that, instead of connecting the predetermined point in each of the balanced-side inductors L2a and L2b to the ground, a DC feed terminal Pdc is connected to a predetermined point in each of the balanced-side inductors L2a and L2b, and capacitors Cga and Cgb for grounding are added.

Figure 13:
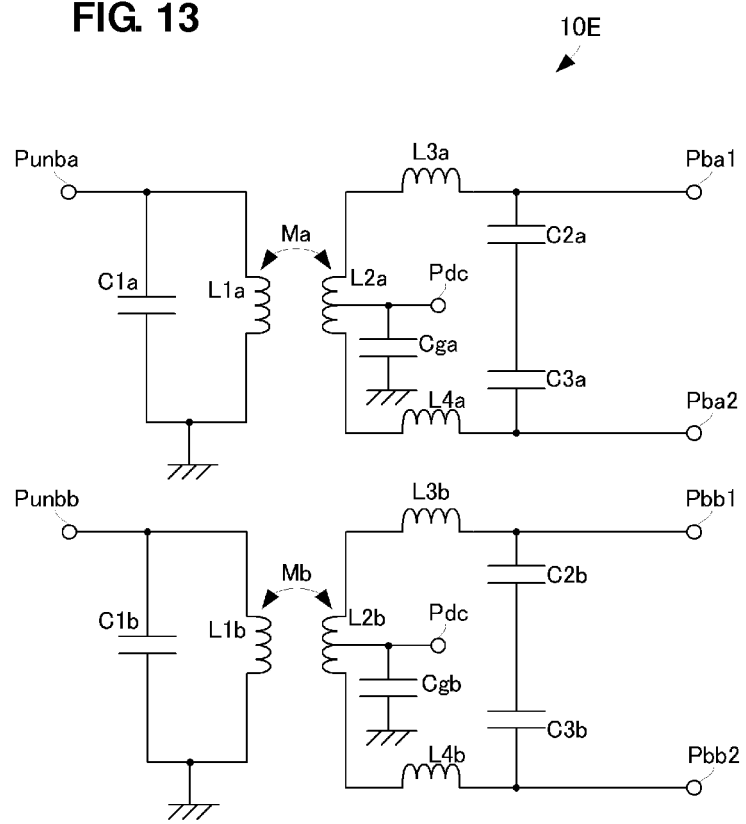
FIG. 13 is a circuit diagram of a multilayer filter according to a fifth preferred embodiment of the present invention.

FIG. 13 is a circuit diagram of the multilayer filter 10E according to the fifth preferred embodiment. As illustrated in FIG. 13, a predetermined point of the balanced-side inductor L2a of the first filter circuit is connected to the DC feed terminal Pdc. A line connecting the DC feed terminal Pdc and the balanced-side inductor L2a is connected to the ground through the capacitor Cga. The other arrangement is similar to that of the first filter circuit in the multilayer filter 10D of the fourth preferred embodiment, and hence the detailed description of the circuit configuration is omitted here.

Also, as illustrated in FIG. 13, a predetermined point of the balanced-side inductor L2b of the second filter circuit is connected to the DC feed terminal Pdc. A line connecting the DC feed terminal Pdc and the balanced-side inductor L2b is connected to the ground through the capacitor Cgb. The other arrangement is similar to that of the second filter circuit in the multilayer filter 10D of the fourth preferred embodiment, and hence the detailed description of the circuit configuration is omitted here.

Figure 14:
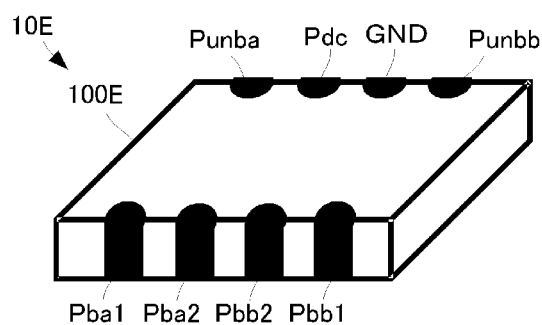
FIG. 14 is an external perspective view of the multilayer filter according to the fifth preferred embodiment of the present invention.
Figure 15:
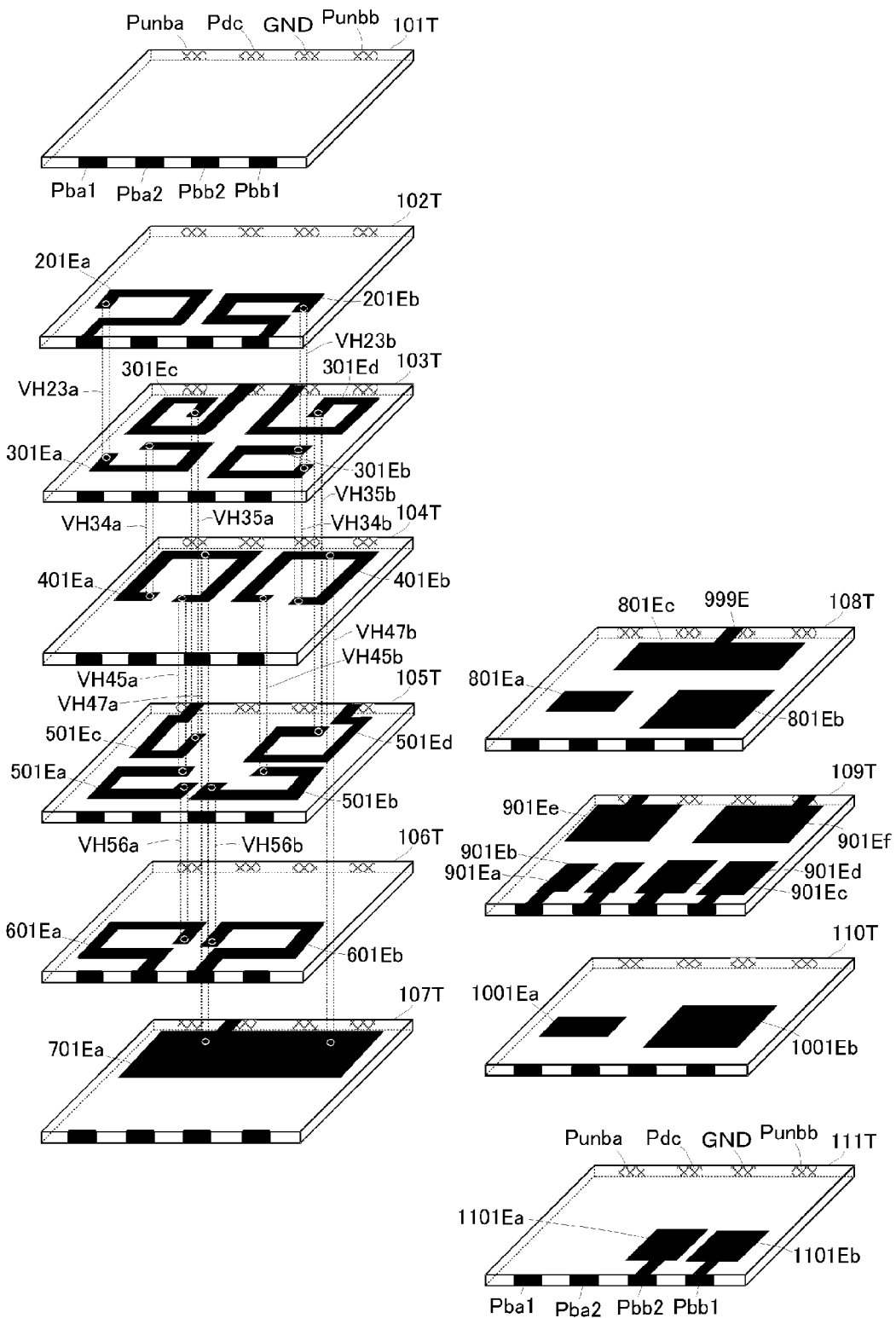
FIG. 15 is an exploded perspective view of the multilayer filter according to the fifth preferred embodiment of the present invention.

FIG. 14 is an external perspective view of the multilayer filter 10E according to the fifth preferred embodiment, and FIG. 15 is an exploded perspective view of the multilayer filter 10E according to the fifth preferred embodiment.

The multilayer filter 10E is realized with a laminate 100E that preferably includes eleven dielectric layers 101T to 111T, for example, stacked on each other.

As illustrated in FIG. 14, the laminate 100E preferably is substantially parallelepiped in its external shape. An outer electrode for the unbalanced terminal (hereinafter referred to as the "unbalanced terminal Punba") of the first filter circuit, an electrode for the DC feed terminal (hereinafter referred to as the "DC feed terminal Pdc"), a ground electrode (hereinafter referred to as the "ground terminal GND"), and an outer electrode for the unbalanced terminal (hereinafter referred to as the "unbalanced terminal Punbb") of the second filter circuit are provided on a first lateral surface of the laminate 100E and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are provided on a second lateral surface of the laminate 100E, which is positioned opposite to the first lateral surface, and are arranged in the order named. In such a structure, the unbalanced terminal Punba and the first balanced terminal Pba1 of the first filter circuit are arranged opposite to each other. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100E. Though not illustrated, a marking electrode used to determine the mounting direction is preferably provided on an upper surface of the dielectric layer 101T, i.e., on a top surface of the laminate 100E.

Coil electrodes 201Ea and 201Eb are provided on the dielectric layer 102T. One end of the coil electrode 201Ea is connected to the first balanced terminal Pba1 of the first filter circuit in the second lateral surface. The coil electrode 201Ea preferably has a coiled shape, as viewed from above, starting from the one end thereof. The other end of the coil electrode 201Ea is connected to one end of a coil electrode 301Ea in the dielectric layer 103T through an electroconductive via electrode VH23a.

One end of the coil electrode 201Eb is connected to the first balanced terminal Pbb1 of the second filter circuit in the second lateral surface. The coil electrode 201Eb preferably has a coiled shape, as viewed from above, starting from the one end thereof. The other end of the coil electrode 201Eb is connected to one end of a coil electrode 301Eb in the dielectric layer 103T through an electroconductive via electrode VH23b.

Coil electrodes 301Ea, 301Eb, 301Ec and 301Ed are provided on the dielectric layer 103T.

The one end of the coil electrode 301Ea is connected to the other end of the coil electrode 201Ea through the via electrode VH23a. The coil electrode 301Ea preferably has a coiled shape preferably extending in the same winding direction as the coil electrode 201Ea, as viewed from above, starting from the one end thereof. The other end of the coil electrode 301Ea is connected to one end of a coil electrode 401Ea in the dielectric layer 104T through an electroconductive via electrode VH34a. The coil electrode 301Ea, the coil electrode 201Ea, and the via electrode VH23a constitute the balanced-side inductor L3a of the first filter circuit.

The one end of the coil electrode 301Eb is connected to the other end of the coil electrode 201Eb through the via electrode VH23b. The coil electrode 301Eb preferably has a coiled shape preferably extending in the same winding direction as the coil electrode 201Eb, as viewed from above, starting from the one end thereof. The other end of the coil electrode 301Eb is connected to one end of a coil electrode 401Eb in the dielectric layer 104T through an electroconductive via electrode VH34b. The coil electrode 301Eb, the coil electrode 201Eb, and the via electrode VH23b constitute the balanced-side inductor L3b of the second filter circuit.

One end of the coil electrode 301Ec is connected to the ground terminal GND of the first filter circuit in the first lateral surface. The coil electrode 301Ec preferably has a coiled shape, as viewed from above, starting from the one end thereof. The other end of the coil electrode 301Ec is connected to one end of a coil electrode 501Ec in the dielectric layer 105T through an electroconductive via electrode VH35a.

One end of the coil electrode 301Ed is connected to the ground terminal GND of the second filter circuit in the first lateral surface. The coil electrode 301Ed preferably has a coiled shape, as viewed from above, starting from the one end thereof. The other end of the coil electrode 301Ed is connected to one end of a coil electrode 501Ed in the dielectric layer 105T through an electroconductive via electrode VH35b.

The coil electrodes 401Ea and 401Eb are provided on the dielectric layer 104T. The one end of the coil electrode 401Ea is connected to the other end of the coil electrode 301Ea through the via electrode VH34a. The coil electrode 401Ea preferably has a coiled shape such that at least a portion thereof overlaps with the coil electrode 301Ec, as viewed from above, for electromagnetic coupling with the coil electrode 301Ec. The other end of the coil electrode 401Ea is connected to one end of a coil electrode 501Ea in the dielectric layer 105T through a via electrode VH45a. The coil electrode 401Ea constitutes the balanced-side inductor L2a of the first filter circuit.

Further, the coil electrode 401Ea is connected at a predetermined position along the winding direction thereof to a plate electrode 701Ea in the dielectric layer 107T through a via electrode VH47a. As described later, the plate electrode 701Ea is one of the opposed electrodes constituting the capacitor Cga, and a plate electrode 801Ec that is the other of the opposed electrodes constituting the capacitor Cga is connected to the ground terminal GND in the first lateral surface. The predetermined position of the coil electrode 401Ea is thereby connected to the ground through the capacitor Cga. As in the above-described preferred embodiments, therefore, by appropriately setting the position where the via electrode VH47a is connected to the coil electrode 401Ea, it is possible to set an optimum phase reference point for the balanced-side inductor L2a and to realize a stable balance characteristic.

The one end of the coil electrode 401Eb is connected to the other end of the coil electrode 301Eb through the via electrode VH34b. The coil electrode 401Eb preferably has a coiled shape such that at least a portion thereof overlaps with the coil electrode 301Ed, as viewed from above, for electromagnetic coupling with the coil electrode 301Ed. The other end of the coil electrode 401Eb is connected to one end of a coil electrode 501Eb in the dielectric layer 105T through a via electrode VH45b. The coil electrode 401Eb constitutes the balanced-side inductor L2b of the second filter circuit.

Further, the coil electrode 401Eb is connected at a predetermined position along the winding direction thereof to the plate electrode 701Ea in the dielectric layer 107T through a via electrode VH47b. As described later, the plate electrode 701Ea is one of the opposed electrodes constituting the capacitor Cgb, and the plate electrode 801Ec that is the other of the opposed electrodes constituting the capacitor Cgb is connected to the ground terminal GND in the first lateral surface. The predetermined position of the coil electrode 401Eb is thereby connected to the ground through the capacitor Cgb. As in the above-described preferred embodiments, therefore, by appropriately setting the position where the via electrode VH47b is connected to the coil electrode 401Eb, it is possible to set an optimum phase reference point for the balanced-side inductor L2b and to realize a stable balance characteristic.

The coil electrodes 501Ea, 501Eb, 501Ec and 501Ed are provided on the dielectric layer 105T.

The one end of the coil electrode 501Ea is connected to the other end of the coil electrode 401Ea through the via electrode VH45a. The coil electrode 501Ea preferably has a coiled shape, as viewed from above, starting from the one end thereof. The coil electrode 501Ea is located in a region on the side closer to the first and second balanced terminals Pba1 and Pba2 of the first filter circuit, i.e., in a region overlapping with the coil electrode 201Ea and 301Ea, when looking at the laminate 100E from above. The other end of the coil electrode 501Ea is connected to one end of a coil electrode 601Ea in the dielectric layer 106T through a via electrode VH56a.

The one end of the coil electrode 501Eb is connected to the other end of the coil electrode 401Eb through the via electrode VH45b. The coil electrode 501Eb preferably has a coiled shape, as viewed from above, starting from the one end thereof. The coil electrode 501Eb is located in a region on the side closer to the first and second balanced terminals Pbb1 and Pbb2 of the second filter circuit, i.e., in a region overlapping with the coil electrode 201Eb and 301Eb, when looking at the laminate 100E from above. The other end of the coil electrode 501Eb is connected to one end of a coil electrode 601Eb in the dielectric layer 106T through a via electrode VH56b.

The one end of the coil electrode 501Ec is connected to the other end of the coil electrode 301Ec through the via electrode VH35a. The coil electrode 501Ec preferably has a coiled shape preferably extending in the same winding direction as the coil electrode 301Ec, as viewed from above, starting from the one end thereof. The coil electrode 501Ec is located at a position where at least a portion thereof overlaps with the coil electrode 401Ea, when looking at the laminate from above, for electromagnetic coupling with the coil electrode 401Ea. The other end of the coil electrode 501Ec is connected to the unbalanced terminal Punba of the first filter circuit. The coil electrode 501Ec, the coil electrode 301Ec, and the via electrode VH35a constitute the unbalanced-side inductor L1a of the first filter circuit.

The one end of the coil electrode 501Ed is connected to the other end of the coil electrode 301Ed through the via electrode VH35b. The coil electrode 501Ed preferably has a coiled shape preferably extending in the same winding direction as the coil electrode 301Ed, as viewed from above, starting from the one end thereof. The coil electrode 501Ed is located at a position where at least a portion thereof overlaps with the coil electrode 401Eb, when looking at the laminate from above, for electromagnetic coupling with the coil electrode 401Eb. The other end of the coil electrode 501Ed is connected to the unbalanced terminal Punbb of the second filter circuit. The coil electrode 501Ed, the coil electrode 301Ed, and the via electrode VH35b constitute the unbalanced-side inductor L1b of the second filter circuit.

The coil electrodes 601Ea and 601Eb are provided on the dielectric layer 106T. The one end of the coil electrode 601Ea is connected to the other end of the coil electrode 501Ea through the via electrode VH56a. The coil electrode 601Ea preferably has a coiled shape preferably extending in the same winding direction as the coil electrode 501Ea, as viewed from above, starting from the one end thereof. The coil electrode 601Ea, the coil electrode 501Ea, and the via electrode VH56a constitute the balanced-side inductor L4a of the first filter circuit.

The one end of the coil electrode 601Eb is connected to the other end of the coil electrode 501Eb through the via electrode VH56b. The coil electrode 601Eb preferably has a coiled shape preferably extending in the same winding direction as the coil electrode 501Eb, as viewed from above, starting from the one end thereof. The coil electrode 601Eb, the coil electrode 501Eb, and the via electrode VH56b constitute the balanced-side inductor L4b of the second filter circuit.

The plate electrode 701Ea preferably having a substantially rectangular shape, as viewed from above, is provided on the dielectric layer 107T. The plate electrode 701Ea is located in a region substantially matching with the regions where the coil electrodes 401Ea and 401Eb in the dielectric layer 104T are formed, when looking at the laminate 100E from above. The plate electrode 701Ea is connected to the DC feed terminal Pdc in the first lateral surface.

Plate electrodes 801Ea, 801Eb and 801Ec, each having a substantially rectangular shape as viewed from above, are provided on the dielectric layer 108T. The plate electrode 801Ec is arranged in opposing relation to the plate electrode 701Ea in the stacking direction. The plate electrode 801Ec is connected to the ground terminal GND in the first lateral surface through an electrode 999E for connection to the ground. The plate electrodes 801Ec and 701Ea and the dielectric layer 107T constitute the DC feed capacitors Cga and Cgb.

DC feed circuits for the balanced-side inductors L2a and L2b are realized with the above-described structures of the dielectric layers 107T and 108T and the above-described connection arrangements of the via electrodes VH47a and VH47b to the coil electrodes 401Ea and 401Eb in the dielectric layer 104T.

The plate electrode 801Ea is located in a region on the side closer to the first and second balanced terminals Pba1 and Pba2 of the first filter circuit, when looking at the laminate 100E from above. The plate electrode 801Ea is a floating electrode that is not connected to any outer terminals including the ground terminal GND.

The plate electrode 801Eb is located in a region on the side closer to the first and second balanced terminals Pbb1 and Pbb2 of the second filter circuit, when looking at the laminate 100E from above. The plate electrode 801Eb is a floating electrode that is not connected to any outer terminals including the ground terminal GND.

Plate electrodes 901Ea, 901Eb, 901Ec, 901Ed, 901Ee and 901Ef, each having a predetermined area and having a substantially rectangular shape as viewed from above, are provided on the dielectric layer 109T.

The plate electrode 901Ee is arranged in opposing relation to the plate electrode 801Ec, when looking at the laminate 100E from above. The plate electrodes 901Ee and 801Ec and the dielectric layer 108T constitute the unbalanced-side capacitor C1a of the first filter circuit. The plate electrode 901Ee is connected to the unbalanced terminal Punba in the first lateral surface.

The plate electrode 901Ef is arranged in opposing relation to the plate electrode 801Ec, when looking at the laminate 100E from above. The plate electrodes 901Ef and 801Ec and the dielectric layer 108T constitute the unbalanced-side capacitor C1b of the second filter circuit. The plate electrode 901Ef is connected to the unbalanced terminal Punbb in the first lateral surface.

The plate electrodes 901Ea and 901Eb are each arranged in opposing relation to the plate electrode 801Ea in the stacking direction. The plate electrodes 901Ec and 901Ed are each arranged in opposing relation to the plate electrode 801Eb in the stacking direction.

Plate electrodes 1001Ea and 1001Eb, each having a substantially rectangular shape as viewed from above, are provided on the dielectric layer 110T. The plate electrode 1001Ea is arranged in opposing relation to the plate electrodes 801Ea and 901Ea, when looking at the laminate 100E from above. The plate electrodes 1001Ea, 901Ea and 801Ea and the dielectric layers 108T and 109T constitute the first balanced-side capacitor C2a of the first filter circuit. Also, the plate electrode 1001Ea is arranged in opposing relation to the plate electrodes 801Ea and 901Eb, when looking at the laminate 100E from above. The plate electrodes 1001Ea, 901Eb and 801Ea and the dielectric layers 108T and 109T constitute the second balanced-side capacitor C3a of the first filter circuit.

The plate electrode 1001Eb is arranged in opposing relation to the plate electrodes 901Ec and 901Ed, when looking at the laminate 100E from above.

Plate electrodes 1101Ea and 1101Eb, each having a substantially rectangular shape as viewed from above, are provided on the dielectric layer 111T. The plate electrode 1101Ea is arranged in opposing relation to the plate electrodes 801Eb, 901Ec and 1001Eb, when looking at the laminate 100E from above. The plate electrodes 1101Ea, 1001Eb, 901Ec and 801Eb and the dielectric layers 108T, 109T and 110T constitute the second balanced-side capacitor C3b of the second filter circuit.

The plate electrode 1101Eb is arranged in opposing relation to the plate electrodes 801Eb, 901Ed and 1001Eb, when looking at the laminate 100E from above. The plate electrodes 1101Eb, 1001Eb, 901Ed and 801Eb and the dielectric layers 108T, 109T and 110T constitute the first balanced-side capacitor C2b of the second filter circuit.

With the above-described arrangement of this fifth preferred embodiment, it is also possible, as in the above-described preferred embodiments, to set an optimum phase reference point for each filter circuit, and to realize the multilayer filter having the stable balance characteristic.

Further, by setting the balanced-side inductors L3a and L4a of the first filter circuit and the balanced-side inductors L3b and L4b of the second filter circuit to the desired inductances in the arrangement of this fifth preferred embodiment, output impedances of the balanced signals can be set to the desired values. Moreover, since the winding directions of the balanced-side inductors L3a, L2a and L4a of the first filter circuit and the winding directions of the balanced-side inductors L3b, L2b and L4b of the second filter circuit are the same, a loss in each filter circuit can be reduced and a filter having a smaller insertion loss can be constituted.

Figure 16:
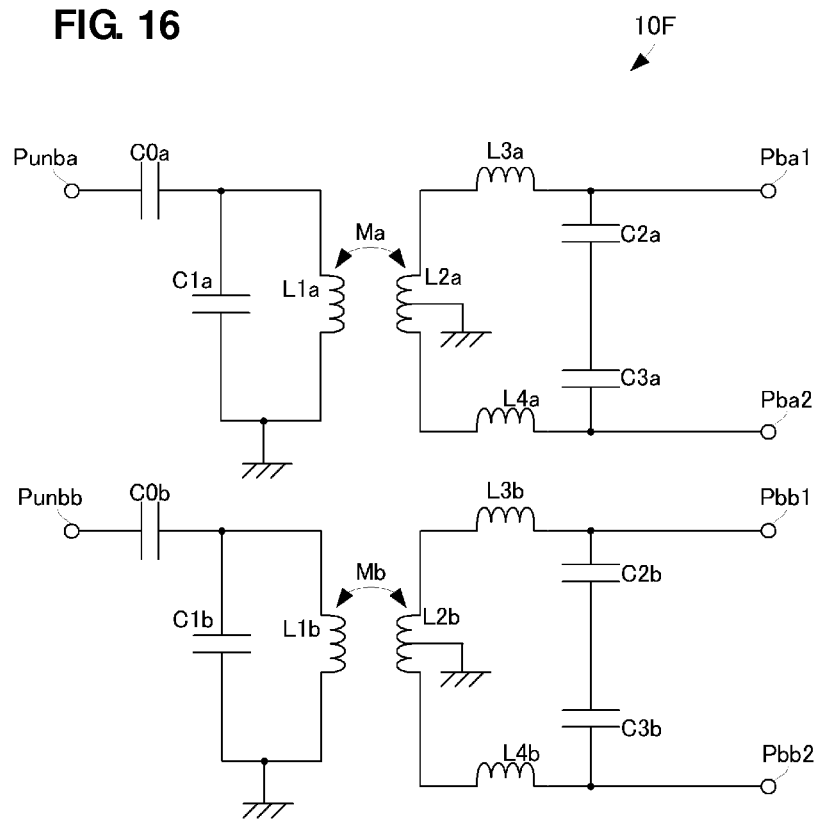
FIG. 16 is a circuit diagram of a multilayer filter according to a sixth preferred embodiment of the present invention.

A multilayer filter according to a sixth preferred embodiment will be described below with reference to the drawings. FIG. 16 is a circuit diagram of a multilayer filter 10F according to the sixth preferred embodiment. As illustrated in FIG. 16, the multilayer filter 10F of this sixth preferred embodiment is constituted preferably by modifying the circuit configuration of the multilayer filter 10D of the fourth preferred embodiment such that a capacitor C0a is connected in series between the unbalanced terminal Punba and the resonance circuit including the unbalanced-side inductor L1a and the unbalanced-side capacitor C1a in the first filter circuit, and such that a capacitor C0b is connected in series between the unbalanced terminal Punbb and the resonance circuit including the unbalanced-side inductor L1b and the unbalanced-side capacitor C1b in the second filter circuit. The description of the other circuit configuration is omitted here.

Figure 17:
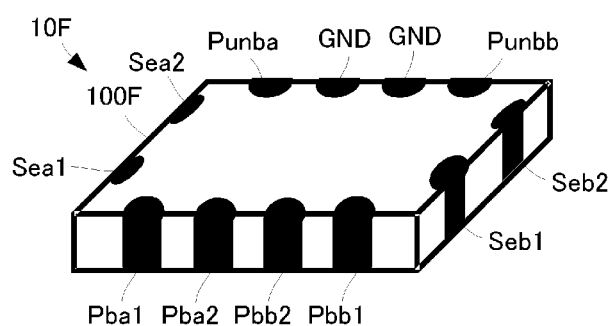
FIG. 17 is an external perspective view of the multilayer filter according to the sixth preferred embodiment of the present invention.
Figure 18:
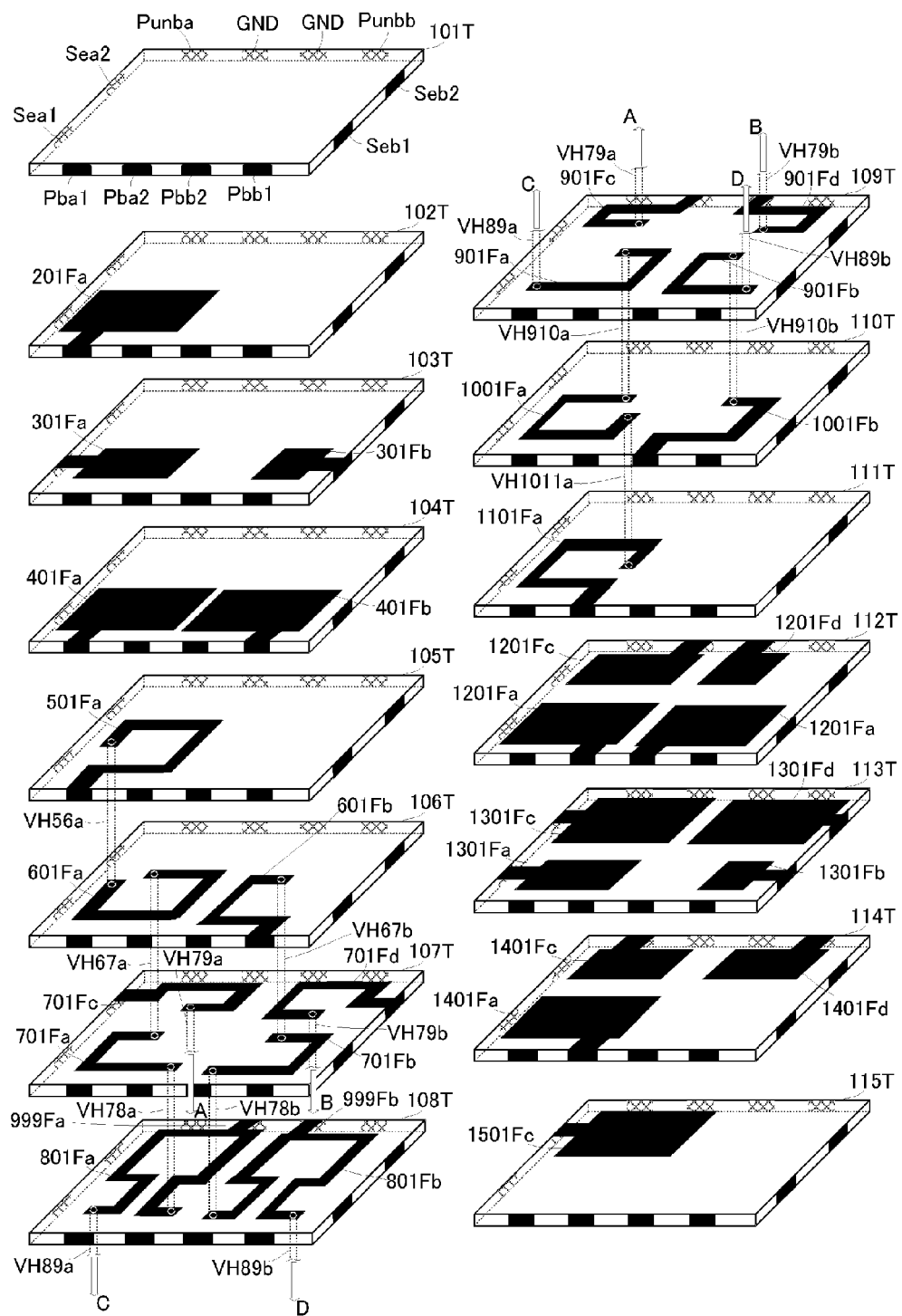
FIG. 18 is an exploded perspective view of the multilayer filter according to the sixth preferred embodiment of the present invention.

FIG. 17 is an external perspective view of the multilayer filter 10F according to the sixth preferred embodiment, and FIG. 18 is an exploded perspective view of the multilayer filter 10F according to the sixth preferred embodiment.

The multilayer filter 10F is realized with a laminate 100F that preferably includes fifteen dielectric layers 101T to 115T, for example, stacked on each other.

As illustrated in FIG. 17, the laminate 100F preferably is substantially parallelepiped in its external shape. An outer electrode for the unbalanced terminal (hereinafter referred to as the "unbalanced terminal Punba") of the first filter circuit, ground electrodes (hereinafter referred to as "ground terminals GND"), and an outer electrode for the unbalanced terminal (hereinafter referred to as the "unbalanced terminal Punbb") of the second filter circuit are provided on a first lateral surface of the laminate 100F and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are provided on a second lateral surface of the laminate 100F, which is positioned opposite to the first lateral surface, and are arranged in the order named. In such a structure, the unbalanced terminal Punba and the first balanced terminal Pba1 of the first filter circuit are arranged opposite to each other.

Connection electrodes Sea1 and Sea2 are provided and arranged on a third lateral surface, which is perpendicular to the first and second lateral surfaces and which is positioned on the same side as the first filter circuit. Connection electrodes Seb1 and Seb2 are provided and arranged on a fourth lateral surface, which is perpendicular to the first and second lateral surfaces, and which is positioned on the same side as the second filter circuit. In the following description of the dielectric layers, as in the description of those in the foregoing preferred embodiments, the positions where the outer terminals are provided and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100F. Though not illustrated, a marking electrode used to determine the mounting direction is preferably provided on an upper surface of the dielectric layer 101T, i.e., on a top surface of the laminate 100F.

A plate electrode 201Fa preferably having a substantially rectangular shape, as viewed from above, is provided on the dielectric layer 102T. The plate electrode 201Fa is located in a region on the side closer to the first and second balanced terminals Pba1 and Pba2 of the first filter circuit, when looking at the laminate 100F from above. The plate electrode 201Fa is connected to the first balanced terminal Pba1 of the first filter circuit in the second lateral surface.

Plate electrodes 301Fa and 301Fb, each having a substantially rectangular shape as viewed from above, are provided on the dielectric layer 103T. The plate electrode 301Fa is arranged in opposing relation to the plate electrode 201Fa in the stacking direction. The plate electrode 301Fa is connected to the connection electrode Sea1 in the third lateral surface.

The plate electrode 301Fb is located in a region on the side closer to the first and second balanced terminals Pbb1 and Pbb2 of the second filter circuit, when looking at the laminate 100F from above. The plate electrode 301Fb is connected to the connection electrode Seb1 in the fourth lateral surface.

Plate electrodes 401Fa and 401Fb, each having a substantially rectangular shape as viewed from above, are provided on the dielectric layer 104T. The plate electrode 401Fa is arranged in opposing relation to the plate electrode 301Fa in the stacking direction. The plate electrode 401Fa is connected to the first balanced terminal Pba1 of the first filter circuit in the second lateral surface.

The plate electrodes 401Fa, 301Fa and 201Fa and the dielectric layers 102T and 103T constitute the first balanced-side capacitor C2a of the first filter circuit.

The plate electrode 401Fb is arranged in opposing relation to the plate electrode 301Fb in the stacking direction. The plate electrode 401Fb is connected to the first balanced terminal Pbb1 of the second filter circuit in the second lateral surface.

The plate electrodes 401Fb, 301Fb and the dielectric layers 103T constitute the second balanced-side capacitor C2b of the first filter circuit.

In the dielectric layer 105T, a coil electrode 501Fa is located in a region on the side where the first filter circuit is located. One end of the coil electrode 501Fa is connected to the first balanced terminal Pba1 of the first filter circuit in the second lateral surface. The coil electrode 501Fa preferably has a coiled shape in the predetermined winding direction, as viewed from above, starting from the one end thereof. The other end of the coil electrode 501Fa is connected to one end of a coil electrode 601Fa in the dielectric layer 106T through a via electrode VH56a.

In the dielectric layer 106T, the coil electrode 601Fa is located in a region on the side where the first filter circuit is located, and a coil electrode 601Fb is located in a region on the side where the second filter circuit is located.

The one end of the coil electrode 601Fa is connected to the other end of the coil electrode 501Fa through the via electrode VH56a. The coil electrode 601Fa preferably has a coiled shape preferably extending in the same winding direction as the coil electrode 501Fa, starting from the one end thereof. The other end of the coil electrode 601Fa is connected to one end of a coil electrode 701Fa in the dielectric layer 107T through a via electrode VH67a.

One end of the coil electrode 601Fb is connected to the first balanced terminal Pbb1 of the second filter circuit in the second lateral surface. The coil electrode 601Fb preferably has a coiled shape in the winding direction reversed to that of the coil electrode 601Fa, starting from the one end thereof. The other end of the coil electrode 601Fb is connected to one end of a coil electrode 701Fb in the dielectric layer 107T through a via electrode VH67b.

In the dielectric layer 107T, coil electrodes 701Fa and 701Fc are located in a region on the side where the first filter circuit is located, and coil electrodes 701Fb and 701Fd are located in a region on the side where the second filter circuit is located.

The one end of the coil electrode 701Fa is connected to the other end of the coil electrode 601Fa through the via electrode VH67a. The coil electrode 701Fa preferably has a coiled shape preferably extending in the same winding direction as the coil electrode 601Fa, starting from the one end thereof. The coil electrodes 701Fa, 601Fa and 501Fa and the via electrodes VH56a and VH67a constitute the balanced-side inductor L3a of the first filter circuit. The other end of the coil electrode 701Fa is connected to one end of a coil electrode 801Fa in the dielectric layer 108T through a via electrode VH78a.

The one end of the coil electrode 701Fb is connected to the other end of the coil electrode 601Fb through the via electrode VH67b. The coil electrode 701Fb preferably has a coiled shape preferably extending in the same winding direction as the coil electrode 601Fb, starting from the one end thereof. The coil electrodes 701Fb and 601Fb and the via electrode VH67b constitute the balanced-side inductor L3b of the second filter circuit. The other end of the coil electrode 701Fb is connected to one end of a coil electrode 801Fb in the dielectric layer 108T through a via electrode VH78b.

The coil electrode 701Fc is located on the side closer to the first lateral surface than the coil electrode 701Fa, i.e., on the side closer to the unbalanced terminal Punba of the first filter circuit, as viewed from above. One end of the coil electrode 701Fc is connected to the connection electrode Sea2 in the third lateral surface. The coil electrode 701Fc preferably has a coiled shape, starting from the one end thereof. The other end of the coil electrode 701Fc is connected to one end of a coil electrode 901Fc in the dielectric layer 109T through a via electrode VH79a.

The coil electrode 701Fd is located on the side closer to the first lateral surface than the coil electrode 701Fb, i.e., on the side closer to the unbalanced terminal Punbb of the second filter circuit, as viewed from above. One end of the coil electrode 701Fd is connected to the connection electrode Seb2 in the fourth lateral surface. The coil electrode 701Fd preferably has a coiled shape in the winding direction reversed to that of the coil electrode 701Fc, starting from the one end thereof. The other end of the coil electrode 701Fd is connected to one end of a coil electrode 901Fd in the dielectric layer 109T through a via electrode VH79b.

In the dielectric layer 108T, the coil electrode 801Fa is located in a region on the side where the first filter circuit is located, and the coil electrode 801Fb is located in a region on the side where the second filter circuit is located.

The one end of the coil electrode 801Fa is connected to the other end of the coil electrode 701Fa through the via electrode VH78a. The coil electrode 801Fa preferably has a coiled shape, starting from the one end thereof. In addition, the coil electrode 801Fa preferably has such a shape that at least a portion thereof overlaps with the coil electrode 701Fc, as viewed from above, for electromagnetic coupling with the coil electrode 701Fc. The other end of the coil electrode 801Fa is connected to one end of a coil electrode 901Fa in the dielectric layer 109T through a via electrode VH89a. The coil electrode 801Fa constitutes the balanced-side inductor L2a of the first filter circuit.

Further, the coil electrode 801Fa is connected at a predetermined position along the winding direction thereof to the ground terminal GND in the first lateral surface through an electrode 999Fa for connection to the ground. As in the above-described preferred embodiments, the position where the electrode 999Fa for connection to the ground is connected to the coil electrode 801Fa is determined such that the desired balance characteristic is obtained.

The one end of the coil electrode 801Fb is connected to the other end of the coil electrode 701Fb through the via electrode VH78b. The coil electrode 801Fb preferably has a coiled shape, starting from the one end thereof. In addition, the coil electrode 801Fb preferably has such a shape that at least a portion thereof overlaps with the coil electrode 701Fd, as viewed from above, for electromagnetic coupling with the coil electrode 701Fd. The other end of the coil electrode 801Fb is connected to one end of a coil electrode 901Fb in the dielectric layer 109T through a via electrode VH89b. The coil electrode 801Fb constitutes the balanced-side inductor L2b of the second filter circuit.

Further, the coil electrode 801Fb is connected at a predetermined position along the winding direction thereof to the ground terminal GND in the first lateral surface through an electrode 999Fb for connection to the ground. As in the above-described preferred embodiments, the position where the electrode 999Fb for connection to the ground is connected to the coil electrode 801Fb is determined such that the desired balance characteristic is obtained.

In the dielectric layer 109T, the coil electrodes 901Fa and 901Fc are located in a region on the side where the first filter circuit is located, and the coil electrodes 901Fb and 901Fd are located in a region on the side where the second filter circuit is located.

The one end of the coil electrode 901Fc is connected to the other end of the coil electrode 701Fc through the via electrode VH79a. The coil electrode 901Fc preferably has a coiled shape preferably extending in the same winding direction as the coil electrode 701Fc, starting from the one end thereof. The coil electrode 901Fa and the coil electrode 701Fc are arranged such that their regions are substantially matched with each other as viewed from above. The coil electrodes 901Fc and 701Fc and the via electrode VH79a constitute the unbalanced-side inductor L1a of the first filter circuit. The other end of the coil electrode 901Fc is connected to the ground terminal GND in the first lateral surface.

The one end of the coil electrode 901Fd is connected to the other end of the coil electrode 701Fd through the via electrode VH79b. The coil electrode 901Fd preferably has a coiled shape preferably extending in the same winding direction as the coil electrode 701Fd, starting from the one end thereof. The coil electrode 901Fd and the coil electrode 701Fd are arranged such that their regions are substantially matched with each other as viewed from above. The coil electrodes 901Fd and 701Fd and the via electrode VH79b constitute the unbalanced-side inductor L1b of the second filter circuit. The other end of the coil electrode 901Fd is connected to the ground terminal GND in the first lateral surface.

The one end of the coil electrode 901Fa is connected to the other end of the coil electrode 801Fa through the via electrode VH89a. The coil electrode 901Fa is located in a region on the side closer to the second lateral surface than the coil electrode 901Fc and preferably has a coiled shape preferably extending in the same winding direction as the coil electrode 701Fa, starting from the one end thereof. The other end of the coil electrode 901Fa is connected to one end of a coil electrode 1001Fa in the dielectric layer 110T through a via electrode VH910a.

The one end of the coil electrode 901Fb is connected to the other end of the coil electrode 801Fb through the via electrode VH89b. The coil electrode 901Fb is located in a region on the side closer to the second lateral surface than the coil electrode 901Fd and preferably has a coiled shape preferably extending in the same winding direction as the coil electrode 701Fb, starting from the one end thereof. The other end of the coil electrode 901Fb is connected to one end of a coil electrode 1001Fb in the dielectric layer 110T through a via electrode VH910b.

In the dielectric layer 110T, the coil electrode 1001Fa is located in a region on the side where the first filter circuit is located, and the coil electrode 1001Fb is located in a region on the side where the second filter circuit is located. The one end of the coil electrode 1001Fa is connected to the other end of the coil electrode 901Fa through the via electrode VH910a. The coil electrode 1001Fa preferably has a coiled shape preferably extending in the same winding direction as the coil electrode 901Fa, starting from the one end thereof. The other end of the coil electrode 1001Fa is connected to one end of a coil electrode 1101Fa in the dielectric layer 111T through a via electrode VH1011a.

The one end of the coil electrode 1001Fb is connected to the other end of the coil electrode 901Fb through the via electrode VH910b. The coil electrode 1001Fb preferably has a coiled shape preferably extending in the same winding direction as the coil electrode 901Fb, starting from the one end thereof. The coil electrodes 1001Fb and 901Fb and the via electrode VH910b constitute the balanced-side inductor L4b of the second filter circuit. The other end of the coil electrode 1001Fb is connected to the second balanced terminal Pbb2 of the second filter circuit in the second lateral surface.

In the dielectric layer 111T, the coil electrode 1101Fa is located in a region on the side where the first filter circuit is located. The one end of the coil electrode 1101Fa is connected to the other end of the coil electrode 1001Fa through the via electrode VH1011a. The coil electrode 1101Fa preferably has a coiled shape preferably extending in the same winding direction as the coil electrode 1001Fa, starting from the one end thereof. The coil electrodes 1101Fa, 1001Fa and 901Fa and the via electrodes VH910a and VH1011a constitute the balanced-side inductor L4a of the first filter circuit. The other end of the coil electrode 1101Fa is connected to the second balanced terminal Pba2 of the first filter circuit in the second lateral surface.

Plate electrodes 1201Fa, 1201Fb, 1201Fc and 1201Fd, each having a predetermined area and having a substantially rectangular shape as viewed from above, are provided on the dielectric layer 112T.

The plate electrode 1201Fc is located in a region on the side closer to the unbalanced terminal Punba of the first filter circuit, when looking at the laminate 100F from above. In other words, the plate electrode 1201Fc is located in a region substantially matching with the regions where the coil electrodes 701Fc and 901Fc are located, when looking at the laminate 100F from above. The plate electrode 1201Fc is connected to the ground terminal GND in the first lateral surface.

The plate electrode 1201Fd is located in a region on the side closer to the unbalanced terminal Punbb of the second filter circuit, when looking at the laminate 100F from above. In other words, the plate electrode 1201Fd is located in a region substantially matching with the regions where the coil electrodes 701Fd and 901Fd are located, when looking at the laminate 100F from above. The plate electrode 1201Fd is connected to the ground terminal GND in the first lateral surface.

The plate electrode 1201Fa is located in a region on the side closer to the first and second balanced terminals Pba1 and Pba2 of the first filter circuit, when looking at the laminate 100F from above. In other words, the plate electrode 1201Fa is located in a region substantially matching with the regions where the coil electrodes 901Fa, 1001Fa and 1101Fa are located, when looking at the laminate 100F from above. The plate electrode 1201Fa is connected to the second balanced terminal Pba2 of the first filter circuit in the second lateral surface.

The plate electrode 1201Fb is located in a region on the side closer to the first and second balanced terminals Pbb1 and Pbb2 of the second filter circuit, when looking at the laminate 100F from above. In other words, the plate electrode 1201Fb is located in a region substantially matching with the regions where the coil electrode 901Fb and 1001Fb are located, when looking at the laminate 100F from above. The plate electrode 1201Fb is connected to the second balanced terminal Pbb2 of the second filter circuit in the second lateral surface.

Plate electrodes 1301Fa, 1301Fb, 1301Fc and 1301Fd, each having a predetermined area and having a substantially rectangular shape as viewed from above, are provided on the dielectric layer 113T.

The plate electrode 1301Fc is arranged in opposing relation to the plate electrode 1201Fc in the stacking direction. The plate electrodes 1301Fc and 1201Fc and the dielectric layer 112T constitute the unbalanced-side capacitor C1a of the first filter circuit. The plate electrode 1301Fc is connected to the connection electrode Sea2 in the third lateral surface.

The plate electrode 1301Fd is arranged in opposing relation to the plate electrode 1201Fd in the stacking direction. The plate electrodes 1301Fd and 1201Fd and the dielectric layer 112T constitute the unbalanced-side capacitor C1b of the second filter circuit. The plate electrode 1301Fd is connected to the connection electrode Seb2 in the fourth lateral surface.

The plate electrode 1301Fa is arranged in opposing relation to the plate electrode 1201Fa in the stacking direction. The plate electrode 1301Fa is connected to the connection electrode Sea1 in the third lateral surface.

The plate electrode 1301Fb is arranged in opposing relation to the plate electrode 1201Fb in the stacking direction. The plate electrode 1301Fb is connected to the connection electrode Seb1 in the fourth lateral surface. The plate electrodes 1301Fb and 1201Fb and the dielectric layer 112T constitute the second balanced-side capacitor C3b of the second filter circuit.

Plate electrodes 1401Fa, 1401Fc and 1401Fd, each having a predetermined area and having a substantially rectangular shape as viewed from above, are provided on the dielectric layer 114T.

The plate electrode 1401Fa is arranged in opposing relation to the plate electrode 1301Fa in the stacking direction. The plate electrodes 1401Fa, 1301Fa and 1201Fa and the dielectric layers 112T and 113T constitute the second balanced-side capacitor C3a of the first filter circuit. The plate electrode 1401Fa is connected to the second balanced terminal Pba2 of the first filter circuit in the second lateral surface.

The plate electrode 1401Fc is arranged in opposing relation to the plate electrode 1301Fc in the stacking direction. The plate electrode 1401Fc is connected to the unbalanced terminal Punba of the first filter circuit in the first lateral surface.

The plate electrode 1401Fd is arranged in opposing relation to the plate electrode 1301Fd in the stacking direction. The plate electrodes 1401Fd and 1301Fd and the dielectric layer 113T constitute the capacitor C0b of the second filter circuit.

A plate electrode 1501Fc having a predetermined area and having a substantially rectangular shape, as viewed from above, is provided on the dielectric layer 115T. The plate electrode 1501Fc is arranged in opposing relation to the plate electrode 1401Fc in the stacking direction. The plate electrodes 1501Fc, 1401Fc and 1301Fc and the dielectric layers 113T and 114T constitute the capacitor C0a of the first filter circuit.

The above-described arrangement of this sixth preferred embodiment can also realize the multilayer filter having the stable balance characteristic as in the above-described preferred embodiments. In addition, since the capacitor is connected in series to the unbalanced terminal, a useless DC signal can be avoided from being input from the unbalanced terminal side.

Further, by setting the balanced-side inductors L3a and L4a of the first filter circuit and the balanced-side inductors L3b and L4b of the second filter circuit to the desired inductances in the arrangement of this sixth preferred embodiment, output impedances of the balanced signals can be set to the desired values. Moreover, since the winding directions of the balanced-side inductors L3a, L2a and L4a of the first filter circuit and the winding directions of the balanced-side inductors L3b, L2b and L4b of the second filter circuit are the same, a loss in each filter circuit can be reduced and a filter having a smaller insertion loss can be provided.

Figure 19:
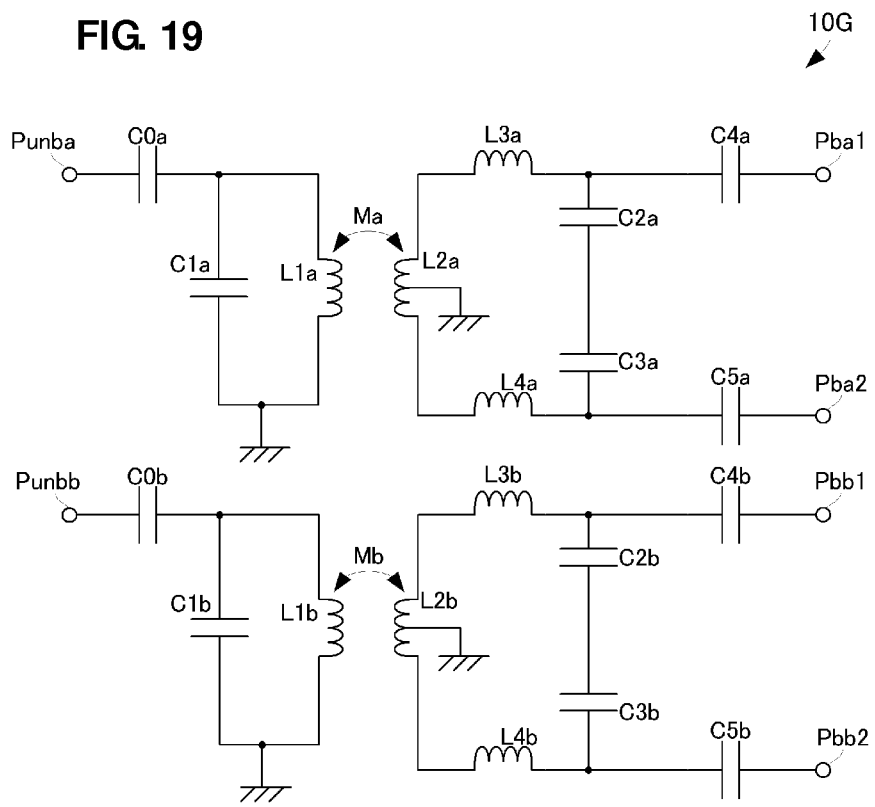
FIG. 19 is a circuit diagram of a multilayer filter according to a seventh preferred embodiment of the present invention.

A multilayer filter according to a seventh preferred embodiment will be described below with reference to the drawings. FIG. 19 is a circuit diagram of a multilayer filter 10G according to the seventh preferred embodiment. As illustrated in FIG. 19, the multilayer filter 10G of this seventh preferred embodiment is constituted preferably by adding, to the multilayer filter 10F of the sixth preferred embodiment, capacitors C4a, C5a, C4b and C5b that are connected in series to the balanced terminals Pba1, Pba2, Pbb1 and Pbb2, respectively. The other circuit configuration is the same as that in the sixth preferred embodiment. Hence, the detailed description of the circuit configuration is omitted here. Further, because outer terminals of the multilayer filter 10G of this seventh preferred embodiment are arranged similarly to those of the multilayer filter 10F of the sixth preferred embodiment, the description of the arrangement of the outer terminals is also omitted here.

Figure 20:
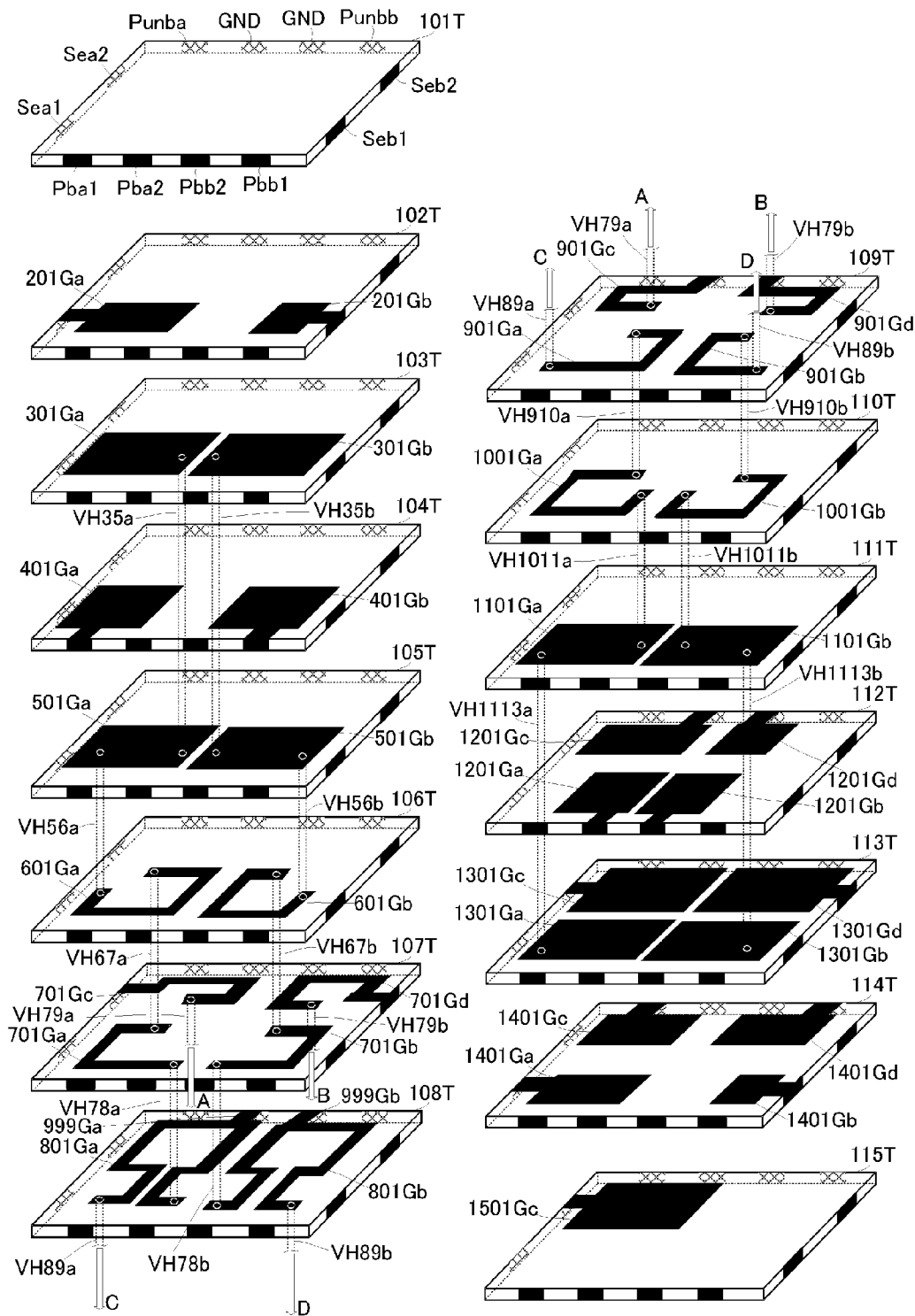
FIG. 20 is an exploded perspective view of the multilayer filter according to the seventh preferred embodiment of the present invention.

FIG. 20 is an exploded perspective view of the multilayer filter 10G according to the seventh preferred embodiment. Only the electrode patterns for the outer terminals are provided on the dielectric layer 101T that is an uppermost layer of the laminate 100G. Though not illustrated, a marking electrode used to determine the mounting direction is preferably provided on an upper surface of the dielectric layer 101T, i.e., on a top surface of the laminate 100G.

Plate electrodes 201Ga and 201Gb, each preferably having a substantially rectangular shape as viewed from above, are provided on the dielectric layer 102T. The plate electrode 201Ga is located in a region on the side closer to the first and second balanced terminals Pba1 and Pba2 of the first filter circuit, when looking at the laminate 100G from above. The plate electrode 201Ga is connected to the connection electrode Sea1 in the third lateral surface.

The plate electrode 201Gb is located in a region on the side closer to the first and second balanced terminals Pbb1 and Pbb2 of the second filter circuit, when looking at the laminate 100G from above. The plate electrode 201Gb is connected to the connection electrode Seb1 in the fourth lateral surface.

Plate electrodes 301Ga and 301Gb, each having a substantially rectangular shape as viewed from above, are provided on the dielectric layer 103T. The plate electrode 301Ga is a floating electrode that is not directly connected to any outer terminals, and it is arranged in opposing relation to the plate electrode 201Ga in the stacking direction. The plate electrode 301Ga is connected to a plate electrode 501Ga in the dielectric layer 105T through a via electrode VH35a.

The plate electrode 301Gb is a floating electrode that is not directly connected to any outer terminals, and it is arranged in opposing relation to the plate electrode 201Gb in the stacking direction. The plate electrode 301Gb is connected to a plate electrode 501Gb in the dielectric layer 105T through a via electrode VH35b.

Plate electrodes 401Ga and 401Gb, each having a substantially rectangular shape as viewed from above, are provided on the dielectric layer 104T. The plate electrode 401Ga is arranged in opposing relation to the plate electrode 301Ga in the stacking direction. The plate electrode 401Ga is connected to the first balanced terminal Pba1 of the first filter circuit in the second lateral surface. The plate electrodes 401Ga, 301Ga and 201Ga and the dielectric layers 102T and 103T constitute the first balanced-side capacitor C2a of the first filter circuit.

The plate electrode 401Gb is arranged in opposing relation to the plate electrode 301Gb in the stacking direction. The plate electrode 401Gb is connected to the first balanced terminal Pbb1 of the second filter circuit in the second lateral surface. The plate electrodes 401Gb, 301Gb and 201Gb and the dielectric layers 102T and 103T constitute the first balanced-side capacitor C2b of the second filter circuit.

Plate electrodes 501Ga and 501Gb each being a floating electrode not directly connected to any outer terminals and having a substantially rectangular shape, as viewed from above, are provided on the dielectric layer 105T. The plate electrode 501Ga is arranged in opposing relation to the plate electrodes 401Ga and 301Ga in the stacking direction. The plate electrode 501Ga is connected to the plate electrode 301Ga through the via electrode VH35a and to one end of a coil electrode 601Ga in the dielectric layer 106T through a via electrode VH56a. The plate electrodes 501Ga and 401Ga and the dielectric layer 104T constitute the capacitor C4a of the first filter circuit.

The plate electrode 501Gb is arranged in opposing relation to the plate electrodes 401Gb and 301Gb in the stacking direction. The plate electrode 501Gb is connected to the plate electrode 301Gb through the via electrode VH35*b* and to one end of a coil electrode 601Gb in the dielectric layer 106T through a via electrode VH56*b*. The plate electrodes 501Gb and 401Gb and the dielectric layer 104T constitute the capacitor C4*b* of the second filter circuit.

In the dielectric layer 106T, the coil electrode 601Ga is located in a region on the side where the first filter circuit is located, and the coil electrode 601Gb is located in a region on the side where the second filter circuit is located. More specifically, the coil electrode 601Ga is located in a region on the side closer to the first and second balanced terminals Pba1 and Pba2 of the first filter circuit. The one end of the coil electrode 601Ga is connected to the plate electrode 501Ga through the via electrode VH56*a*. The coil electrode 601Ga preferably has a coiled shape in the predetermined winding direction, starting from the one end thereof. The other end of the coil electrode 601Ga is connected to one end of a coil electrode 701Ga in the dielectric layer 107T through a via electrode VH67*a*.

The coil electrode 601Gb is located in a region on the side closer to the first and second balanced terminals Pbb1 and Pbb2 of the second filter circuit. The one end of the coil electrode 601Gb is connected to the plate electrode 501Gb through the via electrode VH56*b*. The coil electrode 601Gb preferably has a coiled shape in the winding direction reversed to that of the coil electrode 601Ga, starting from the one end thereof. The other end of the coil electrode 601Gb is connected to one end of a coil electrode 701Gb in the dielectric layer 107T through a via electrode VH67*b*.

In the dielectric layer 107T, coil electrodes 701Ga and 701Gc are located in a region on the side where the first filter circuit is located, and coil electrodes 701Gb and 701Gd are located in a region on the side where the second filter circuit is located.

The one end of the coil electrode 701Ga is connected to the other end of the coil electrode 601Ga through the via electrode VH67*a*. The coil electrode 701Ga preferably has a coiled shape preferably extending in the same winding direction as the coil electrode 601Ga, starting from the one end thereof. The coil electrodes 701Ga and 601Ga and the via electrode VH67*a* constitute the balanced-side inductor L3*a* of the first filter circuit. The other end of the coil electrode 701Ga is connected to one end of a coil electrode 801Ga in the dielectric layer 108T through a via electrode VH78*a*.

The one end of the coil electrode 701Gb is connected to the other end of the coil electrode 601Gb through the via electrode VH67*b*. The coil electrode 701Gb preferably has a coiled shape preferably extending in the same winding direction as the coil electrode 601Gb, starting from the one end thereof. The coil electrodes 701Gb and 601Gb and the via electrode VH67*b* constitute the balanced-side inductor L3*b* of the second filter circuit. The other end of the coil electrode 701Gb is connected to one end of a coil electrode 801Gb in the dielectric layer 108T through a via electrode VH78*b*.

The coil electrode 701Gc is located on the side closer to the first lateral surface than the coil electrode 701Ga, i.e., on the side closer to the unbalanced terminal Punba of the first filter circuit, as viewed from above. One end of the coil electrode 701Gc is connected to the connection electrode Sea2 in the third lateral surface. The coil electrode 701Gc preferably has a coiled shape, starting from the one end thereof. The other end of the coil electrode 701Gc is connected to one end of a coil electrode 901Gc in the dielectric layer 109T through a via electrode VH79*a*.

The coil electrode 701Gd is located on the side closer to the first lateral surface than the coil electrode 701Gb, i.e., on the side closer to the unbalanced terminal Punbb of the second filter circuit, as viewed from above. One end of the coil electrode 701Gd is connected to the connection electrode Seb2 in the fourth lateral surface. The coil electrode 701Gd preferably has a coiled shape in the winding direction reversed to that of the coil electrode 701Gc, starting from the one end thereof. The other end of the coil electrode 701Gd is connected to one end of a coil electrode 901Gd in the dielectric layer 109T through a via electrode VH79*b*.

In the dielectric layer 108T, the coil electrode 801Ga is located in a region on the side where the first filter circuit is located, and the coil electrode 801Gb is located in a region on the side where the second filter circuit is located.

The one end of the coil electrode 801Ga is connected to the other end of the coil electrode 701Ga through the via electrode VH78*a*. The coil electrode 801Ga preferably has a coiled shape, starting from the one end thereof. In addition, the coil electrode 801Ga preferably has such a shape that at least a portion thereof overlaps with the coil electrode 701Gc, as viewed from above, for electromagnetic coupling with the coil electrode 701Gc. The other end of the coil electrode 801Ga is connected to one end of a coil electrode 901Ga in the dielectric layer 109T through a via electrode VH89*a*. The coil electrode 801Ga constitutes the balanced-side inductor L2*a* of the first filter circuit.

Further, the coil electrode 801Ga is connected at a predetermined position along the winding direction thereof to the ground terminal GND in the first lateral surface through an electrode 999Ga for connection to the ground. As in the above-described preferred embodiments, the position where the electrode 999Ga for connection to the ground is connected to the coil electrode 801Ga is determined such that the desired balance characteristic is obtained.

The one end of the coil electrode 801Gb is connected to the other end of the coil electrode 701Gb through the via electrode VH78*b*. The coil electrode 801Gb preferably has a coiled shape, starting from the one end thereof. In addition, the coil electrode 801Gb preferably has such a shape that at least a portion thereof overlaps with the coil electrode 701Gd, as viewed from above, for electromagnetic coupling with the coil electrode 701Gd. The other end of the coil electrode 801Gb is connected to one end of a coil electrode 901Gb in the dielectric layer 109T through a via electrode VH89*b*. The coil electrode 801Gb constitutes the balanced-side inductor L2*b* of the second filter circuit.

Further, the coil electrode 801Gb is connected at a predetermined position along the winding direction thereof to the ground terminal GND in the first lateral surface through an electrode 999Gb for connection to the ground. As in the above-described preferred embodiments, the position where the electrode 999Gb for connection to the ground is connected to the coil electrode 801Gb is determined such that the desired balance characteristic is obtained.

In the dielectric layer 109T, the coil electrodes 901Ga and 901Gc are located in a region on the side where the first filter circuit is located, and the coil electrodes 901Gb and 901Gd are located in a region on the side where the second filter circuit is located.

The one end of the coil electrode 901Gc is connected to the other end of the coil electrode 701Gc through the via electrode VH79*a*. The coil electrode 901Gc preferably has a coiled shape preferably extending in the same winding direction as the coil electrode 701Gc, starting from the one end thereof. The coil electrode 901Ga and the coil electrode 701Gc are arranged such that their regions are substantially matched with each other as viewed from above. The coil electrodes 901Gc and 701Gc and the via electrode VH79*a* constitute the unbalanced-side inductor L1*a* of the first filter circuit. The other end of the coil electrode 901Gc is connected to the ground terminal GND in the first lateral surface.

The one end of the coil electrode 901Ga is connected to the other end of the coil electrode 801Ga through the via electrode VH89a. The coil electrode 901Ga is located in a region on the side closer to the second lateral surface than the coil electrode 901Gc and preferably has a coiled shape preferably extending in the same winding direction as the coil electrode 701Ga, starting from the one end thereof. The other end of the coil electrode 901Ga is connected to one end of a coil electrode 1001Ga in the dielectric layer 110T through a via electrode VH910a.

The one end of the coil electrode 901Gb is connected to the other end of the coil electrode 801Gb through the via electrode VH89b. The coil electrode 901Gb is located in a region on the side closer to the second lateral surface than the coil electrode 901Gd and preferably has a coiled shape preferably extending in the same winding direction as the coil electrode 701Gb, starting from the one end thereof. The other end of the coil electrode 901Gb is connected to one end of a coil electrode 1001Gb in the dielectric layer 110T through a via electrode VH910b.

In the dielectric layer 110T, the coil electrode 1001Ga is located in a region on the side where the first filter circuit is located, and the coil electrode 1001Gb is located in a region on the side where the second filter circuit is located. The one end of the coil electrode 1001Ga is connected to the other end of the coil electrode 901Ga through the via electrode VH910a. The coil electrode 1001Ga preferably has a coiled shape preferably extending in the same winding direction as the coil electrode 901Ga, starting from the one end thereof. The coil electrodes 1001Ga and 901Ga and the via electrode VH910a constitute the balanced-side inductor L4a of the first filter circuit. The other end of the coil electrode 1001Ga is connected to a plate electrode 1101Ga in the dielectric layer 111T through a via electrode VH1011a.

The one end of the coil electrode 1001Gb is connected to the other end of the coil electrode 901Gb through the via electrode VH910b. The coil electrode 1001Gb preferably has a coiled shape preferably extending in the same winding direction as the coil electrode 901Gb, starting from the one end thereof. The coil electrodes 1001Gb and 901Gb and the via electrode VH910b constitute the balanced-side inductor L4b of the second filter circuit. The other end of the coil electrode 1001Gb is connected to a plate electrode 1101Gb in the dielectric layer 111T through a via electrode VH1011b.

The plate electrodes 1101Ga and 1101Gb, each having a predetermined area and having a substantially rectangular shape as viewed from above, are provided on the dielectric layer 111T. The plate electrodes 1101Ga and 1101Gb are floating electrodes that are not directly connected to any outer terminals.

The plate electrode 1101Ga is located in a region on the side closer to the first and second balanced terminals Pba1 and Pba2 of the first filter circuit, when looking at the laminate 100G from above. In other words, the plate electrode 1101Ga is located in a region substantially matching with the regions where the coil electrode 901Ga and 1001Ga are located, when looking at the laminate 100G from above. The plate electrode 1101Ga is connected to a plate electrode 1301Ga in the dielectric layer 113T through a via electrode VH1113a.

The plate electrode 1101Gb is located in a region on the side closer to the first and second balanced terminals Pbb1 and Pbb2 of the second filter circuit, when looking at the laminate 100G from above. In other words, the plate electrode 1101Gb is located in a region substantially matching with the regions where the coil electrode 901Gb and 1001Gb are located, when looking at the laminate 100G from above. The plate electrode 1101Gb is connected to a plate electrode 1301Gb in the dielectric layer 113T through a via electrode VH1113b.

Plate electrodes 1201Ga, 1201Gb, 1201Gc and 1201Gd, each having a predetermined area and having a substantially rectangular shape as viewed from above, are provided on the dielectric layer 112T.

The plate electrode 1201Ga is arranged in opposing relation to the plate electrode 1101Ga in the stacking direction. The plate electrodes 1201Ga and 1101Ga and the dielectric layer 111T constitute the capacitor C5a of the first filter circuit. The plate electrode 1201Ga is connected to the second balanced terminal Pba2 of the first filter circuit in the second lateral surface.

The plate electrode 1201Gb is arranged in opposing relation to the plate electrode 1101Gb in the stacking direction. The plate electrodes 1201Gb and 1101Gb and the dielectric layer 111T constitute the capacitor C5b of the second filter circuit. The plate electrode 1201Gb is connected to the second balanced terminal Pbb2 of the second filter circuit in the second lateral surface.

The plate electrode 1201Gc is located in a region on the side closer to the unbalanced terminal Punba of the first filter circuit, when looking at the laminate 100G from above. In other words, the plate electrode 1201Gc is located in a region substantially matching with the regions where the coil electrodes 701Gc and 901Gc are located, when looking at the laminate 100G from above. The plate electrode 1201Gc is connected to the ground terminal GND in the first lateral surface.

The plate electrode 1201Gd is located in a region on the side closer to the unbalanced terminal Punbb of the second filter circuit, when looking at the laminate 100G from above. In other words, the plate electrode 1201Gd is located in a region substantially matching with the regions where the coil electrodes 701Gd and 901Gd are located, when looking at the laminate 100G from above. The plate electrode 1201Gd is connected to the ground terminal GND in the first lateral surface.

Plate electrodes 1301Ga, 1301Gb, 1301Gc and 1301Gd, each having a predetermined area and having a substantially rectangular shape as viewed from above, are provided on the dielectric layer 113T.

The plate electrode 1301Gc is arranged in opposing relation to the plate electrode 1201Gc in the stacking direction. The plate electrodes 1301Gc and 1201Gc and the dielectric layer 112T constitute the unbalanced-side capacitor C1a of the first filter circuit. The plate electrode 1301Gc is connected to the connection electrode Sea2 in the third lateral surface.

The plate electrode 1301Gd is arranged in opposing relation to the plate electrode 1201Gd in the stacking direction. The plate electrodes 1301Gd and 1201Gd and the dielectric layer 112T constitute the unbalanced-side capacitor C1b of the second filter circuit. The plate electrode 1301Gd is connected to the connection electrode Seb2 in the fourth lateral surface.

The plate electrode 1301Ga is arranged in opposing relation to the plate electrodes 1101Ga and 1201Ga in the stacking direction. The plate electrode 1301Ga is a floating electrode that is not directly connected to any outer terminals. The plate electrode 1301Ga is connected to the plate electrode 1101Ga through the via electrode VH1113a.

The plate electrode 1301Gb is arranged in opposing relation to the plate electrodes 1101Gb and 1201Gb in the stacking direction. The plate electrode 1301Gb is a floating electrode that is not directly connected to any outer terminals. The plate electrode 1301Gb is connected to the plate electrode 1101Gb through the via electrode VH1113b.

Plate electrodes 1401Ga, 1401Gb, 1401Gc and 1401Gd, each having a predetermined area and having a substantially rectangular shape as viewed from above, are provided on the dielectric layer 114T.

The plate electrode 1401Ga is arranged in opposing relation to the plate electrode 1301Ga in the stacking direction. The plate electrode 1401Ga is connected to the connection electrode Sea1 in the third lateral surface. The plate electrodes 1401Ga, 1301Ga and 1201Ga and the dielectric layers 112T and 113T constitute the second balanced-side capacitor C3a of the first filter circuit.

The plate electrode 1401Gb is arranged in opposing relation to the plate electrode 1301Gb in the stacking direction. The plate electrode 1401Gb is connected to the connection electrode Seb1 in the fourth lateral surface. The plate electrodes 1401Gb, 1301Gb and 1201Gb and the dielectric layers 112T and 113T constitute the second balanced-side capacitor C3b of the second filter circuit.

The plate electrode 1401Gc is arranged in opposing relation to the plate electrode 1301Gc in the stacking direction. The plate electrode 1401Gc is connected to the unbalanced terminal Punba of the first filter circuit in the first lateral surface.

The plate electrode 1401Gd is arranged in opposing relation to the plate electrode 1301Gd in the stacking direction. The plate electrodes 1401Gd and 1301Gd and the dielectric layer 113T constitute the capacitor C0b of the second filter circuit. The plate electrode 1401Gd is connected to the unbalanced terminal Punbb of the second filter circuit in the first lateral surface.

A plate electrode 1501Gc having a predetermined area and having a substantially rectangular shape, as viewed from above, is provided on the dielectric layer 115T. The plate electrode 1501Gc is arranged in opposing relation to the plate electrode 1401Gc in the stacking direction. The plate electrodes 1501Gc, 1401Gc and 1301Gc and the dielectric layers 113T and 114T constitute the capacitor C0a of the first filter circuit.

The above-described arrangement of this seventh preferred embodiment can also realize the multilayer filter having the stable balance characteristic as in the above-described preferred embodiments. In addition, since the capacitor is connected in series to each of the unbalanced terminals and the balanced terminals, a useless DC signal can be avoided from being input from the unbalanced terminal side and the balanced terminal side.

Further, by setting the balanced-side inductors L3a and L4a of the first filter circuit and the balanced-side inductors L3b and L4b of the second filter circuit to the desired inductances in the arrangement of this seventh preferred embodiment, output impedances of the balanced signals can be set to the desired values. Moreover, since the winding directions of the balanced-side inductors L3a, L2a and L4a of the first filter circuit and the winding directions of the balanced-side inductors L3b, L2b and L4b of the second filter circuit are the same, a loss in each filter circuit can be reduced and a filter having a smaller insertion loss can be constituted.

A multilayer filter according to an eighth preferred embodiment will be described below with reference to the drawings. A multilayer filter 10H of this eighth preferred embodiment has the same circuit configuration as that of the multilayer filter 10D of the fourth preferred embodiment, and hence the detailed description of the circuit configuration is omitted here.

Figure 21:
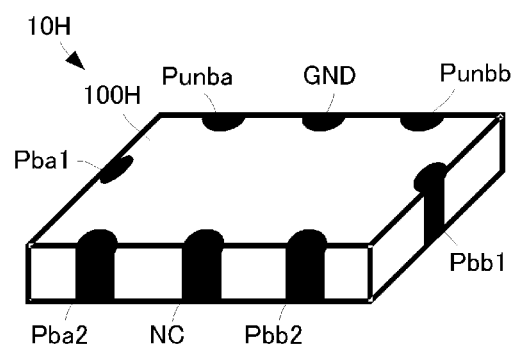
FIG. 21 is an external perspective view of a multilayer filter according to an eighth preferred embodiment of the present invention.
Figure 22:
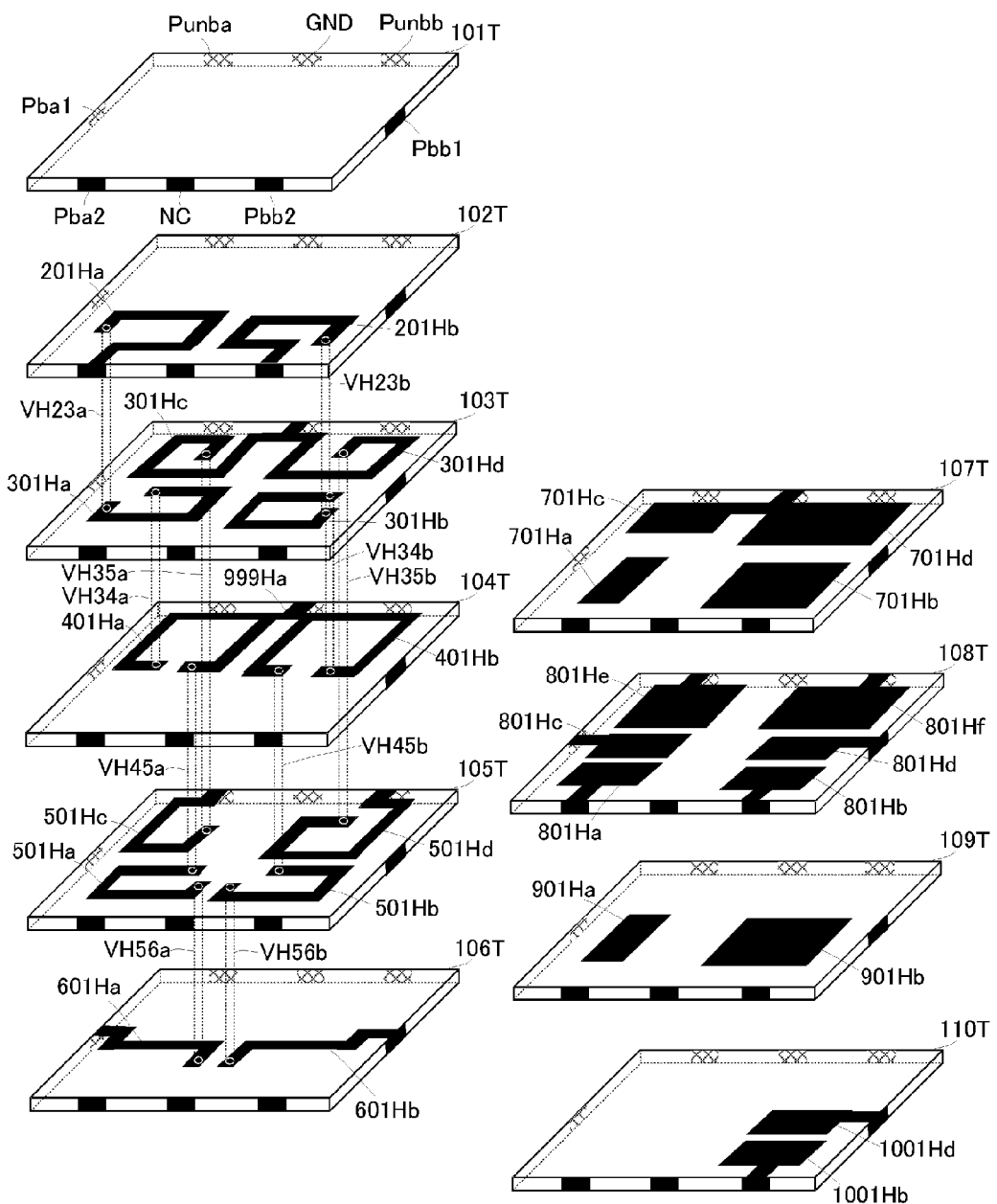
FIG. 22 is an exploded perspective view of the multilayer filter according to the eighth preferred embodiment of the present invention.

FIG. 21 is an external perspective view of the multilayer filter 10H according to the eighth preferred embodiment, and FIG. 22 is an exploded perspective view of the multilayer filter 10H according to the eighth preferred embodiment.

The circuit elements constituting the first filter circuit and the circuit elements constituting the second filter circuit are provided in separate regions, when looking at a laminate 100H from above, so that the circuit elements of the first and second filter circuits are not coupled with each other in a high-frequency range. Further, winding directions of inductors are reversed between the first and second filter circuits as seen from FIG. 22 in which the winding directions in a practical example are illustrated. Such a structure can suppress coupling between the first filter circuit and the second filter circuit.

The multilayer filter 10H is realized with the laminate 100H that preferably includes ten dielectric layers 101T to 110T, for example, stacked on each other.

As illustrated in FIG. 21, the laminate 100H preferably is substantially parallelepiped in its external shape. An outer electrode for the unbalanced terminal (hereinafter referred to as the "unbalanced terminal Punba") of the first filter circuit, a ground electrode (hereinafter referred to as the "ground terminal GND"), and an outer electrode for the unbalanced terminal (hereinafter referred to as the "unbalanced terminal Punbb") of the second filter circuit are provided on a first lateral surface of the laminate 100H and are arranged in the order named. In this eighth preferred embodiment, one ground terminal GND is provided on the first lateral surface.

An outer electrode for the second balanced terminal (hereinafter referred to as the "second balanced terminal Pba2") of the first filter circuit and an outer electrode for the second balanced terminal (hereinafter referred to as the "second balanced terminal Pbb2") of the second filter circuit are provided on a second lateral surface of the laminate 100H, which is positioned opposite to the first lateral surface, with an NC terminal positioned therebetween and are arranged in the order named. In such a structure, the unbalanced terminal Punba and the second balanced terminal Pba2 of the first filter circuit are arranged opposite to each other.

An outer electrode for the first balanced terminal (hereinafter referred to as the "first balanced terminal Pba1") of the first filter circuit is provided on a third lateral surface, which is perpendicular to the first and second lateral surfaces and which is positioned on the first filter circuit side. An outer electrode for the first balanced terminal (hereinafter referred to as the "first balanced terminal Pbb1") of the second filter circuit is provided on a fourth lateral surface, which is perpendicular to the first and second lateral surfaces and which is positioned on the second filter circuit side. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100H. Though not illustrated, a marking electrode used to determine the mounting direction is preferably provided on an upper surface of the dielectric layer 101T, i.e., on a top surface of the laminate 100H.

Coil electrodes 201Ha and 201Hb are provided on the dielectric layer 102T. One end of the coil electrode 201Ha is connected to the second balanced terminal Pba2 of the first filter circuit in the second lateral surface. The coil electrode 201Ha preferably has a coiled shape, as viewed from above, starting from the one end thereof. The other end of the coil electrode 201Ha is connected to one end of a coil electrode 301Ha in the dielectric layer 103T through an electroconductive via electrode VH23a.

One end of the coil electrode 201Hb is connected to the second balanced terminal Pbb2 of the second filter circuit in the second lateral surface. The coil electrode 201Hb preferably has a coiled shape, as viewed from above, starting from the one end thereof. The other end of the coil electrode 201Hb is connected to one end of a coil electrode 301Hb in the dielectric layer 103T through an electroconductive via electrode VH23b.

Coil electrodes 301Ha, 301Hb, 301Hc and 301Hd are provided on the dielectric layer 103T.

The one end of the coil electrode 301Ha is connected to the other end of the coil electrode 201Ha through the via electrode VH23a. The coil electrode 301Ha preferably has a coiled shape preferably extending in the same winding direction as the coil electrode 201Ha, as viewed from above, starting from the one end thereof. The other end of the coil electrode 301Ha is connected to one end of a coil electrode 401Ha in the dielectric layer 104T through an electroconductive via electrode VH34a. The coil electrode 301Ha, the coil electrode 201Ha, and the via electrode VH23a constitute the balanced-side inductor L4a of the first filter circuit.

The one end of the coil electrode 301Hb is connected to the other end of the coil electrode 201Hb through the via electrode VH23b. The coil electrode 301Hb preferably has a coiled shape preferably extending in the same winding direction as the coil electrode 201Hb, as viewed from above, starting from the one end thereof. The other end of the coil electrode 301Hb is connected to one end of a coil electrode 401Hb in the dielectric layer 104T through an electroconductive via electrode VH34b. The coil electrode 301Hb, the coil electrode 201Hb, and the via electrode VH23b constitute the balanced-side inductor L4b of the second filter circuit.

One end of the coil electrode 301Hc is connected to the ground terminal GND in the first lateral surface. The coil electrode 301Hc preferably has a coiled shape, as viewed from above, starting from the one end thereof. The other end of the coil electrode 301Hc is connected to one end of a coil electrode 501Hc in the dielectric layer 105T through an electroconductive via electrode VH35a.

One end of the coil electrode 301Hd is connected to the ground terminal GND in the first lateral surface. The coil electrode 301Hd preferably has a coiled shape, as viewed from above, starting from the one end thereof. The other end of the coil electrode 301Hd is connected to one end of a coil electrode 501Hd in the dielectric layer 105T through an electroconductive via electrode VH35b. The one end of the coil electrode 301Hc and the one end of the coil electrode 301Hd are connected to one ground terminal GND through a common electrode for connection to the ground.

The coil electrodes 401Ha and 401Hb are provided on the dielectric layer 104T. The one end of the coil electrode 401Ha is connected to the other end of the coil electrode 301Ha through the via electrode VH34a. The coil electrode 401Ha preferably has a coiled shape such that at least a portion thereof overlaps with the coil electrode 301Hc, as viewed from above, for electromagnetic coupling with the coil electrode 301Hc. The other end of the coil electrode 401Ha is connected to one end of a coil electrode 501Ha in the dielectric layer 105T through a via electrode VH45a. The coil electrode 401Ha constitutes the balanced-side inductor L2a of the first filter circuit.

The one end of the coil electrode 401Hb is connected to the other end of the coil electrode 301Hb through the via electrode VH34b. The coil electrode 401Hb preferably has a coiled shape such that at least a portion thereof overlaps with the coil electrode 301Hd, as viewed from above, for electromagnetic coupling with the coil electrode 301Hd. The other end of the coil electrode 401Hb is connected to one end of a coil electrode 501Hb in the dielectric layer 105T through a via electrode VH45b. The coil electrode 401Hb constitutes the balanced-side inductor L2b of the second filter circuit.

The coil electrodes 401Ha and 401Hb are connected at predetermined positions along the coiled shapes thereof to the ground terminal GND in the first lateral surface through a common electrode 999Ha for connection to the ground. The balanced-side inductors L2a and L2b are thereby connected at their predetermined points to the ground.

The coil electrodes 501Ha, 501Hb, 501Hc and 501Hd are provided on the dielectric layer 105T.

The one end of the coil electrode 501Ha is connected to the other end of the coil electrode 401Ha through the via electrode VH45a. The coil electrode 501Ha preferably has a coiled shape, as viewed from above, starting from the one end thereof. The coil electrode 501Ha is located in a region on the side closer to the first and second balanced terminals Pba1 and Pba2 of the first filter circuit, i.e., in a region overlapping with the coil electrodes 201Ha and 301Ha, when looking at the laminate 100H from above. The other end of the coil electrode 501Ha is connected to one end of a coil electrode 601Ha in the dielectric layer 106T through a via electrode VH56a.

The one end of the coil electrode 501Hb is connected to the other end of the coil electrode 401Hb through the via electrode VH45b. The coil electrode 501Hb preferably has a coiled shape, as viewed from above, starting from the one end thereof. The coil electrode 501Hb is located in a region on the side closer to the first and second balanced terminals Pbb1 and Pbb2 of the second filter circuit, i.e., in a region overlapping with the coil electrodes 201Hb and 301Hb, when looking at the laminate 100H from above. The other end of the coil electrode 501Hb is connected to one end of a coil electrode 601Hb in the dielectric layer 106T through a via electrode VH56b.

The one end of the coil electrode 501Hc is connected to the other end of the coil electrode 301Hc through the via electrode VH35a. The coil electrode 501Hc preferably has a coiled shape preferably extending in the same winding direction as the coil electrode 301Hc, as viewed from above, starting from the one end thereof. Further, the coil electrode 501Hc is located at a position where at least a portion thereof overlaps with the coil electrode 401Ha, when looking at the laminate 100H from above, for electromagnetic coupling with the coil electrode 401Ha. The other end of the coil electrode 501Hc is connected to the unbalanced terminal Punba of the first filter circuit. The coil electrode 501Hc, the coil electrode 301Hc, and the via electrode VH35a constitute the unbalanced-side inductor L1a of the first filter circuit.

The one end of the coil electrode 501Hd is connected to the other end of the coil electrode 301Hd through the via electrode VH35b. The coil electrode 501Hd preferably has a coiled shape preferably extending in the same winding direction as the coil electrode 301Hd, as viewed from above, starting from the one end thereof. Further, the coil electrode 501Hd is located at a position where at least a portion thereof overlaps with the coil electrode 401Hb, when looking at the laminate 100H from above, for electromagnetic coupling with the coil electrode 401Hb. The other end of the coil electrode 501Hd is connected to the unbalanced terminal Punbb of the second filter circuit. The coil electrode 501Hd, the coil electrode 301Hd, and the via electrode VH35b constitute the unbalanced-side inductor L1b of the second filter circuit.

The coil electrodes 601Ha and 601Hb are provided on the dielectric layer 106T. The one end of the coil electrode 601Ha is connected to the other end of the coil electrode 501Ha through the via electrode VH56a. The coil electrode 601Ha preferably has a coiled shape preferably extending in the same winding direction as the coil electrode 501Ha, as viewed from above, starting from the one end thereof. The coil electrode 601Ha, the coil electrode 501Ha, and the via electrode VH56a constitute the balanced-side inductor L3a of the first filter circuit.

The one end of the coil electrode 601Hb is connected to the other end of the coil electrode 501Hb through the via electrode VH56b. The coil electrode 601Hb preferably has a coiled shape preferably extending in the same winding direction as the coil electrode 501Hb, as viewed from above, starting from the one end thereof. The coil electrode 601Hb, the coil electrode 501Hb, and the via electrode VH56b constitute the balanced-side inductor L3b of the second filter circuit.

Plate electrodes 701Ha, 701Hb, 701Hc and 701Hd, each having a predetermined area and having a substantially rectangular shape as viewed from above, are provided on the dielectric layer 107T.

The plate electrode 701Hc is located in a region on the side closer to the unbalanced terminal Punba of the first filter circuit, when looking at the laminate 100H from above. In other words, the plate electrode 701Hc is located in a region substantially matching with the regions where the coil electrodes 301Hc and 501Hc are located, when looking at the laminate 100H from above. The plate electrode 701Hc is connected to the ground terminal GND in the first lateral surface.

The plate electrode 701Hd is located in a region on the side closer to the unbalanced terminal Punbb of the second filter circuit, when looking at the laminate 100H from above. In other words, the plate electrode 701Hd is located in a region substantially matching with the regions where the coil electrodes 301Hd and 501Hd are located, when looking at the laminate 100H from above. The plate electrode 701Hd is connected to the ground terminal GND in the first lateral surface.

In the above arrangement, the plate electrodes 701Hc and 701Hd are connected to one ground terminal GND through a common electrode for connection to the ground.

The plate electrode 701Ha is located in a region on the side closer to the second balanced terminal Pba2 of the first filter circuit, when looking at the laminate 100H from above. The plate electrode 701Ha is a floating electrode that is not connected to any outer terminals including the ground terminal GND.

The plate electrode 701Hb is located in a region on the side closer to the second balanced terminal Pbb2 of the second filter circuit, when looking at the laminate 100H from above. The plate electrode 701Hb is a floating electrode that is not connected to any outer terminals including the ground terminal GND.

Plate electrodes 801Ha, 801Hb, 801Hc, 801Hd, 801He and 801Hf, each having a predetermined area and preferably having a substantially rectangular shape as viewed from above, are provided on the dielectric layer 108T.

The plate electrode 801He is arranged in opposing relation to the plate electrode 701Hc in the stacking direction, i.e., when looking at the laminate 100H from above. The plate electrodes 801He and 701Hc and the dielectric layer 107T constitute the unbalanced-side capacitor C1a of the first filter circuit. The plate electrode 801He is connected to the unbalanced terminal Punba of the first filter circuit in the first lateral surface.

The plate electrode 801Hf is arranged in opposing relation to the plate electrode 701Hd in the stacking direction, i.e., when looking at the laminate 100F from above. The plate electrodes 801Hf and 701Hd and the dielectric layer 107T constitute the unbalanced-side capacitor C1b of the second filter circuit. The plate electrode 801Hf is connected to the unbalanced terminal Punbb of the second filter circuit in the first lateral surface.

The plate electrodes 801Ha and 801Hc are each arranged in opposing relation to the plate electrode 701Ha in the stacking direction. The plate electrode 801Ha is connected to the second balanced terminal Pba2 of the first filter circuit in the second lateral surface, and the plate electrode 801Hc is connected to the first balanced terminal Pba1 of the first filter circuit in the third lateral surface.

The plate electrodes 801Hb and 801Hd are each arranged in opposing relation to the plate electrode 701Hb in the stacking direction. The plate electrode 801Hb is connected to the second balanced terminal Pbb2 of the second filter circuit in the second lateral surface, and the plate electrode 801Hd is connected to the first balanced terminal Pbb1 of the second filter circuit in the fourth lateral surface.

Plate electrodes 901Ha and 901Hb, each having a predetermined area and preferably having a substantially rectangular shape as viewed from above, are provided on the dielectric layer 109T. The plate electrode 901Ha is arranged in opposing relation to the plate electrodes 801Ha and 801Hc in the stacking direction. The plate electrodes 901Ha, 801Ha and 701Ha and the dielectric layers 107T and 108T constitute the second balanced-side capacitor C3a of the first filter circuit. The plate electrodes 901Ha, 801Hc and 701Ha and the dielectric layers 107T and 108T constitute the first balanced-side capacitor C2a of the first filter circuit.

The plate electrode 901Hb is arranged in opposing relation to the plate electrodes 801Hb and 801Hd in the stacking direction.

Plate electrodes 1001Hb and 1001Hd, each having a predetermined area and preferably having a substantially rectangular shape as viewed from above, are provided on the dielectric layer 110T. The plate electrodes 1001Hb and 1001Hd are each arranged in opposing relation to the plate electrode 901Hb in the stacking direction.

The plate electrodes 701Hb, 801Hb, 901Hb and 1001Hb and the dielectric layers 107T, 108T and 109T constitute the second balanced-side capacitor C3b of the second filter circuit. The plate electrodes 701Hb, 801Hd, 901Hb and 1001Hd and the dielectric layers 107T, 108T and 109T constitute the first balanced-side capacitor C2b of the second filter circuit.

The plate electrode 1001Hb is connected to the second balanced terminal Pbb2 of the second filter circuit in the second lateral surface. The plate electrode 1001Hd is connected to the first balanced terminal Pbb1 of the second filter circuit in the fourth lateral surface.

The above-described arrangement of this eighth preferred embodiment can also realize the multilayer filter having the stable balance characteristic as in the above-described preferred embodiments. In addition, since the ground terminal GND is shared by the first filter circuit and the second filter circuit and only one ground terminal is provided in the lateral surface of the laminate 100H, the size of the laminate 100H can be further reduced.

Further, by setting the balanced-side inductors L3a and L4a of the first filter circuit and the balanced-side inductors L3*b* and L4*b* of the second filter circuit to the desired inductances in the arrangement of this eighth preferred embodiment, output impedances of the balanced signals can be set to the desired values. Moreover, since the winding directions of the balanced-side inductors L3*a*, L2*a* and L4*a* of the first filter circuit and the winding directions of the balanced-side inductors L3*b*, L2*b* and L4*b* of the second filter circuit are the same, a loss in each filter circuit can be reduced and a filter having a smaller insertion loss can be provided.

While a capacitance (capacity) ratio between the balanced-side capacitors C2 and C3 is not specified in the above-described preferred embodiments, the capacitance ratio may be appropriately set depending on the other circuit elements and circuit patterns constituting the multilayer filter. Such setting may be performed by changing respective areas of the opposed plate electrodes of the balanced-side capacitors C2 and C3.

The number of dielectric layers stacked in each of the above-described preferred embodiments may be appropriately set, as required, depending on the specifications, etc.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer filter comprising:
   a laminate including a plurality of dielectric layers stacked on each other;
   an unbalanced terminal;
   a first balanced terminal;
   a second balanced terminal corresponding to the unbalanced terminal; and
   a filter circuit;
   an unbalanced-side inductor connected between the unbalanced terminal and a ground; and
   a balanced-side inductor electromagnetically coupled with the unbalanced-side inductor, the balanced-side inductor including a first end connected to the first balanced terminal and a second end connected to the second balanced terminal; wherein
   the balanced-side inductor includes a coil electrode provided in an inner layer of the laminate and having a substantially helical shape;
   the coil electrode constituting the balanced-side inductor is connected at a predetermined position along a winding direction thereof to the ground through an electrode provided to connect to the ground;
   the coil electrode constituting the balanced-side inductor includes an odd number of coil electrode portions including at least three coil electrode portions connected in series; and
   each of the at least three coil electrode portions is disposed on one of the plurality of dielectric layers that does not contain another of the at least three coil electrode portions.

2. The multilayer filter according to claim 1, wherein a grounding capacitor is defined by a pair of opposed electrodes, which are positioned opposite to each other with one of the plurality of dielectric layers interposed therebetween, is connected at one end to a line connected to a center of the coil electrode constituting the balanced-side inductor, and at another end to an intermediate point of the electrode provided to connect to the ground.

3. The multilayer filter according to claim 2, wherein one of the opposed electrodes constituting the grounding capacitor and positioned on a side closer to the coil electrode constituting the balanced-side inductor is connected to a DC feed terminal.

4. The multilayer filter according to claim 1, wherein:
   a coil electrode portion of the at least three coil electrode portions at a center in an array sequence of the at least three coil electrodes portions and a coil electrode constituting the unbalanced-side inductor are positioned in the laminate to be electromagnetically couple with each other; and
   the at least three coil electrode portions each having the same winding direction when viewed in a stacking direction of the plurality of dielectric layers of the laminate.

5. The multilayer filter according to claim 4, wherein:
   the coil electrode portion at the center is arranged over a larger area than areas over which the other coil electrodes portions of the at least three coil electrode portions are located when viewing the laminate from above; and
   the coil electrode constituting the unbalanced-side inductor is arranged substantially opposite in the stacking direction to a portion of the coil electrode portion at the center, which portion is not overlapped with the other coil electrodes of the at least three coil electrode portions.

6. The multilayer filter according to claim 1, wherein:
   a balanced-side capacitor is connected between the first balanced terminal and the second balanced terminal; and
   the balanced-side capacitor includes a first capacitor including opposed electrodes, one of which is a first inner-layer plate electrode electrically connected to the first balanced terminal and the other of which is a first floating electrode not connected to the ground, and a second capacitor including opposed electrodes one of which is a second inner-layer plate electrode electrically conducted to the second balanced terminal and the other of which is a second floating electrode not connected to the ground, the first capacitor and the second capacitor being connected in series.

* * * * *